(12) United States Patent
Chakravarti et al.

(10) Patent No.: US 9,059,006 B2
(45) Date of Patent: Jun. 16, 2015

(54) REPLACEMENT-GATE-COMPATIBLE PROGRAMMABLE ELECTRICAL ANTIFUSE

(75) Inventors: Satya N. Chakravarti, Hopewell Junction, NY (US); Dechao Guo, Ossining, NY (US); Chuck T. Le, Poughkeepsie, NY (US); Byoung W. Min, Austin, TX (US); Thekkemadathil V. Rajeevakumar, Scarsdale, NY (US); Keith Kwong Hon Wong, Wappingers Falls, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 557 days.

(21) Appl. No.: 13/523,120

(22) Filed: Jun. 14, 2012

(65) Prior Publication Data
US 2012/0249160 A1 Oct. 4, 2012

Related U.S. Application Data

(63) Continuation of application No. 12/503,116, filed on Jul. 15, 2009, now Pat. No. 8,237,457.

(51) Int. Cl.
| | |
|---|---|
| *G01R 27/08* | (2006.01) |
| *H01L 23/52* | (2006.01) |
| *H01L 29/10* | (2006.01) |
| *H01L 27/06* | (2006.01) |
| *H01L 23/525* | (2006.01) |
| *H01L 27/112* | (2006.01) |
| *H01L 29/66* | (2006.01) |
| *H01L 29/49* | (2006.01) |
| *H01L 29/78* | (2006.01) |

(52) U.S. Cl.
CPC ........ *H01L 27/0617* (2013.01); *H01L 23/5252* (2013.01); *H01L 27/112* (2013.01); *H01L 27/11206* (2013.01); *H01L 29/4966* (2013.01); *H01L 29/66545* (2013.01); *H01L 29/7833* (2013.01)

(58) Field of Classification Search
CPC ............. H01L 27/0617; H01L 27/112; H01L 27/11206; H01L 29/66545; H01L 29/4966; H01L 29/7833; H01L 23/5252
USPC ............ 324/713, 691, 649, 600; 257/50, 209, 257/213, 288, 368, 394, 395, 402, 405, 406, 257/528, 529, 530, E23.147
See application file for complete search history.

(56) References Cited

U.S. PATENT DOCUMENTS

| | | | |
|---|---|---|---|
| 5,293,133 | A | 3/1994 | Birkner et al. |
| 5,486,707 | A | 1/1996 | Look et al. |
| 6,627,970 | B2 | 9/2003 | Fuller et al. |
| 7,075,829 | B2 | 7/2006 | Forbes |
| 2009/0141533 | A1 | 6/2009 | Kim et al. |
| 2010/0032732 | A1 | 2/2010 | Booth et al. |

*Primary Examiner* — Hoai-An D Nguyen
(74) *Attorney, Agent, or Firm* — Scully, Scott, Murphy & Presser, P.C.; Yuanmin Cai

(57) ABSTRACT

After planarization of a gate level dielectric layer, a dummy structure is removed to form a recess. A first conductive material layer and an amorphous metal oxide are deposited into the recess area. A second conduct material layer fills the recess. After planarization, an electrical antifuse is formed within the filled recess area, which includes a first conductive material portion, an amorphous metal oxide portion, and a second conductive material portion. To program the electrical antifuse, current is passed between the two terminals in the pair of the conductive contacts to transform the amorphous metal oxide portion into a crystallized metal oxide portion, which has a lower resistance. A sensing circuit determines whether the metal oxide portion is in an amorphous state (high resistance state) or in a crystalline state (low resistance state).

20 Claims, 22 Drawing Sheets

REPLACEMENT-GATE-COMPATIBLE PROGRAMMABLE ELECTRICAL ANTIFUSE

CROSS REFERENCE TO RELATED APPLICATION

This application is a continuation of U.S. patent application Ser. No. 12/503,116 filed on Jul. 15, 2009 the entire content and disclosure of which is incorporated herein by reference.

BACKGROUND

The present invention relates to semiconductor structures, and particularly to electrical antifuses that are compatible with another semiconductor structure having a replacement gate electrode and methods of manufacturing the same.

Electrical fuses and electrical antifuses are used in the semiconductor industry to implement array redundancy, field programmable arrays, analog component trimming circuits, and chip identification circuits. Once programmed, the programmed state of an electrical fuse or an electrical antifuse does not revert to the original state on its own, that is, the programmed state of the fuse is not reversible. For this reason, electrical fuses and electrical antifuses are called One-Time-Programmable (OTP) memory elements.

Programming or lack of programming constitutes one bit of stored information in fuses or antifuses. The difference between fuses and antifuses is the way the resistance of the memory element is changed during the programming process. Semiconductor fuses have a low initial resistance state that may be changed to a higher resistance state through programming, i.e., through electrical bias conditions applied to the fuse. In contrast, semiconductor antifuses have a high initial resistance state that may be changed to a low resistance state through programming.

Continuous advances in the semiconductor technology oftentimes require changes in the material employed in semiconductor structures. Of particular relevance is the advent of a replacement gate electrode technology for field effect transistors, which employs formation of a dummy gate electrode prior to formation of source and drain regions. After formation of a gate-level dielectric layer and subsequent planarization, the material of the dummy gate is removed. Some versions of the replacement gate technology enable formation of a gate dielectric after removal of the dummy gate to avoid high temperature treatment and consequent thermal decomposition of the gate dielectric. Other versions of the replacement gate technology formed gate conductors without replacing a gate dielectric, which is formed before formation of the dummy gate. In this case, multiple types of gate materials may be employed for different devices for optimized performance.

A challenge that the replacement gate technology poses is formation of other devices without adding excessive processing cost by sharing the same manufacturing processing steps with field effect transistors as much as possible. OTP memory elements are among such devices that are constrained in terms of processing sequences. Cost-effective and reliable OTP memory elements that are compatible with replacement gate technology are thus desired.

BRIEF SUMMARY

In one embodiment the present invention provides an electrical antifuse that may be programmed by changing the resistance of an amorphous metal oxide plate formed at the same level as replacement gate electrodes by passing current through a conductive layer that contacts the amorphous oxide plate, and methods of manufacturing the same.

A dummy structure is formed over an insulator structure embedded in a substrate at the time of formation of a dummy transistor gate. After formation of source and drain regions and a gate level dielectric layer, the dummy structure is removed to form a recess area while simultaneously removing the dummy transistor gate. A first conductive material layer and an amorphous metal oxide are deposited into the recess area. A second conduct material layer fills the recess. After planarization, an electrical antifuse is formed within the filled recess area, which includes a first conductive material portion, an amorphous metal oxide portion, and a second conductive material portion. A pair of conductive contacts is made to the first conductive material portion, and a conductive contact is made to the second conductive material portion. To program the electrical antifuse, current is passed between the two terminals in the pair of the conductive contacts. The heat from the current crystallized the amorphous metal oxide portion to transform it into a crystallized metal oxide portion, which has a lower resistance. A sensing circuit is employed to detect the level of resistance of the metal oxide portion to determine whether the metal oxide portion is in an amorphous state (high resistance state) or in a crystalline state (low resistance state).

According to an aspect of the present invention, a semiconductor structure is provided, which includes: a dielectric layer located on a top surface of a semiconductor substrate; and an electrical antifuse located within a recessed area in the dielectric layer, wherein the electrical antifuse includes: an inner conductive material portion; a dielectric metal oxide portion laterally abutting and enclosing the inner conductive material portion; and an outer conductive material portion laterally abutting and enclosing the dielectric metal oxide portion, wherein the outer conductive material portion is separated from the inner conductive material portion by the dielectric metal oxide portion.

In one embodiment, the semiconductor structure further includes: a pair of conductive contacts located directly on the outer conductive material portion; a semiconductor device configured to provide electrical current through one of the pair of conductive contacts, the outer conductive material portion, and the other of the pair of conductive contacts; and another conductive contact located directly on the inner conductive material portion.

According to another aspect of the present invention, a method of forming a semiconductor structure is provided, which includes: forming a dummy structure on a semiconductor substrate; forming a dielectric layer over the dummy structure and planarizing the dielectric layer; removing the dummy structure and forming a recessed area within the dielectric layer; and forming an electrical antifuse within the recessed area, wherein the electrical antifuse includes: an inner conductive material portion; a dielectric metal oxide portion laterally abutting and enclosing the inner conductive material portion; and an outer conductive material portion laterally abutting and enclosing the dielectric metal oxide portion, wherein the outer conductive material portion is separated from the inner conductive material portion by the dielectric metal oxide portion.

According to yet another aspect of the present invention, a method of operating an electrical antifuse is provided, which includes: providing an electrical antifuse including: an inner conductive material portion; a dielectric metal oxide portion laterally abutting and enclosing the inner conductive material portion and including an amorphous dielectric metal oxide material; and an outer conductive material portion laterally abutting and enclosing the dielectric metal oxide portion, wherein the outer conductive material portion is separated from the inner conductive material portion by the dielectric metal oxide portion; and passing electrical current through the outer conductive material portion, whereby heat from the outer conductive material portion transforms an amorphous state of the dielectric metal oxide portion into a crystalline state.

In one embodiment, the method further includes measuring electrical current or voltage differential across the dielectric metal oxide portion between the inner conductive material portion and the outer conductive material portion, whereby resistance of the dielectric metal oxide portion is measured.

DETAILED DESCRIPTION

Figure 1:
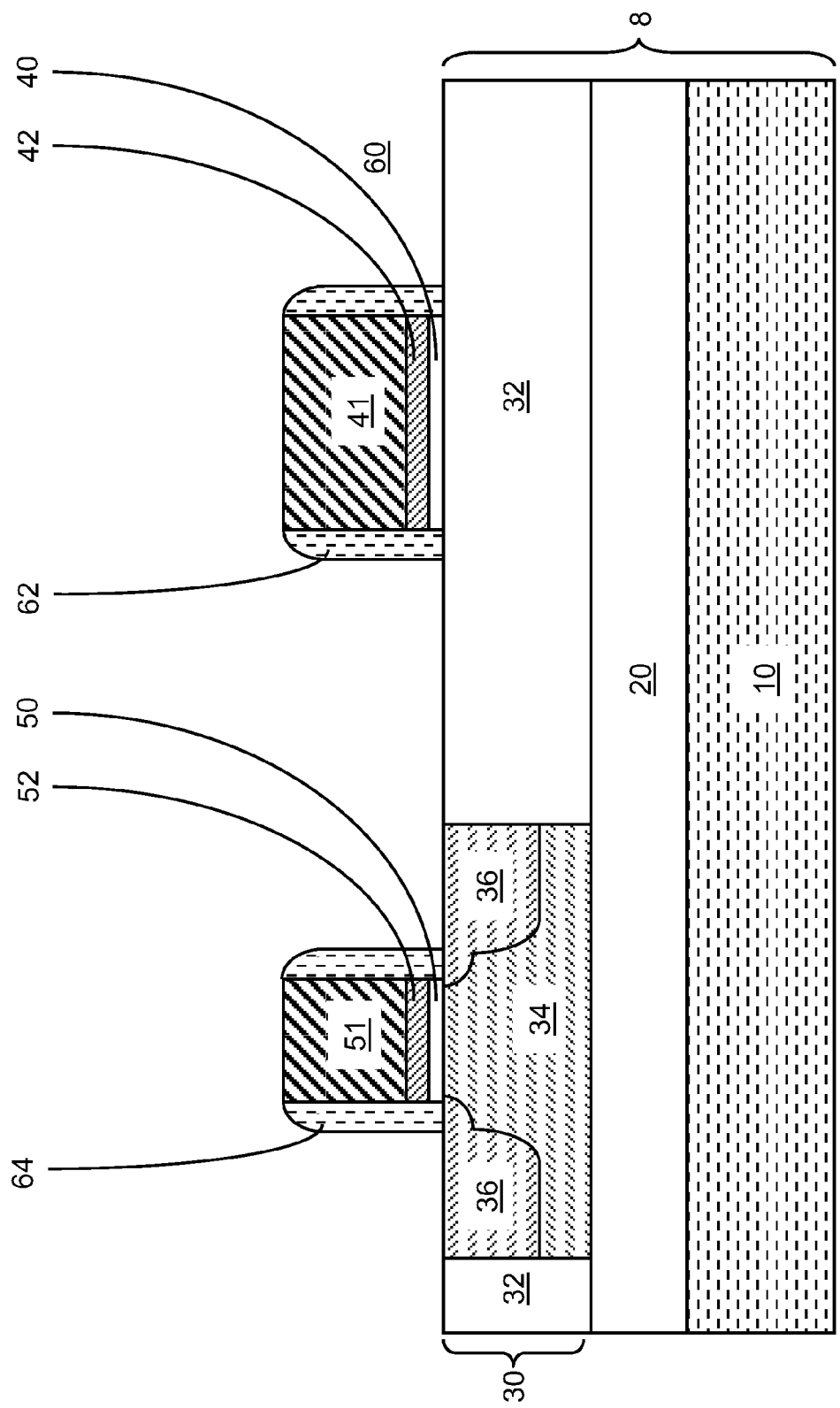
FIG. 1 is a vertical cross-sectional view of a first exemplary semiconductor structure after formation of dummy structures according to a first embodiment of the present invention.

As stated above, the present invention relates to electrical antifuses that are compatible with another semiconductor structure having a replacement gate electrode and methods of manufacturing the same, which are now described in detail with accompanying figures. It is noted that like and corresponding elements mentioned herein and illustrated in the drawings are referred to by like reference numerals.

FIG. 1 is a vertical cross-sectional view of a first exemplary semiconductor structure after formation of dummy structures according to a first embodiment of the present invention. The first exemplary semiconductor structure includes a prototype field effect transistor and a prototype structure for forming an electrical antifuse of the present invention. The prototype field effect transistor and the prototype structure are located on a semiconductor substrate 8, which may be a bulk substrate, a semiconductor-on-insulator (SOI) substrate, or a hybrid substrate including a bulk portion and an SOI portion. While the present invention is described with an SOI substrate, equivalent embodiments employing other types of substrates are also contemplated herein.

The semiconductor substrate 8 includes a handle substrate 10, a buried insulator layer 20, and a top semiconductor layer 30. The top semiconductor layer 30 includes at least one semiconductor portion and a shallow trench isolation structure 32, which complimentarily fill the top semiconductor layer 30. The semiconductor portion contains a semiconductor material such as silicon, a silicon containing alloy, a germanium containing alloy, a III-V compound semiconductor, or a II-IV semiconductor. Preferably, the semiconductor portion within the top semiconductor layer 30 is single crystalline. The shallow trench isolation structure 32 comprises a dielectric material and provides electrical isolation between semiconductor devices formed on the top semiconductor layer 30.

The prototype field effect transistor and the prototype structure are formed employing methods known in the art. For example, a stack of a high dielectric constant (high-k) material layer and a metal layer may be formed on a top surface of the semiconductor substrate 8. The high dielectric constant material layer comprises a high-k dielectric material, which comprises a dielectric metal oxide having a dielectric constant that is greater than the dielectric constant of silicon oxide of 3.9. The high-k dielectric material is also known as high-k gate dielectric material in the art. The dielectric metal oxide is a high-k material including a metal and oxygen, and optionally nitrogen. For example, the high-k dielectric material may comprise one of $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, and an alloy thereof. Each value of x is independently from about 0.5 to about 3 and each value of y is independently from 0 to about 2.

The high dielectric constant material layer may be formed by methods well known in the art including, for example, a chemical vapor deposition (CVD), an atomic layer deposition (PVD), molecular beam epitaxy (MBE), pulsed laser deposition (PLD), liquid source misted chemical deposition (LSMCD), etc. The thickness of the high dielectric constant material layer 30L may be from about 2 nm to about 6 nm, and may have an effective oxide thickness on the order of or less than 1 nm.

The metal layer is formed directly on the high dielectric constant material layer, for example, by chemical vapor deposition (CVD), physical vapor deposition (PVD), atomic layer deposition (ALD), etc. The metal layer comprises a conductive metallic material which may be a metal, a metal alloy, or a metallic nitride. For example, the metal layer may comprise a material such as TaN, TiN, WN, TiAlN, TaCN, other conductive refractory metallic nitrides, or an alloy thereof. The conductive metallic material is also known as metal gate material in the art. The thickness of the metal layer 40L may be from about 5 nm to about 40 nm, and preferably from about 7 nm to about 20 nm, although lesser and greater thicknesses are also contemplated herein. The composition of the metal layer may be selected to optimize performance of semiconductor devices such as a threshold voltage of a transistor employing a metal gate.

A dummy material layer is then formed on the metal layer. The dummy material layer comprises a material that may be readily removed selective to other materials such as the dielectric material to be subsequently employed for a gate level dielectric layer. For example, the dummy material layer may comprise a semiconductor material such as silicon, a silicon containing alloy, a germanium containing alloy, a III-V compound semiconductor, or a II-IV semiconductor.

The material stack of the dummy material layer, the metal layer, and the high dielectric constant material layer is lithographically patterned to form a first dummy structure and a second dummy structure. The first dummy structure is preferably formed on shallow trench isolation structure 32, and includes a first dielectric material portion 40, a first metal portion 42, and a first dummy material portion 41. The first dummy structure (40, 42, 41) is the prototype structure for forming the electrical antifuse of the present invention. The second dummy structure is formed on the semiconductor portion of the top semiconductor layer 30. The second dummy structure includes a second dielectric material portion 50, a second metal portion 52, and a second dummy material portion 51. The second dummy structure (50, 52, 51) forms a portion of the prototype field effect transistor of one embodiment of the present invention.

Masked ion implantation steps are performed to form source and drain regions 36 in the semiconductor portion of the top semiconductor layer 32. Because the first dummy structure serves as an implantation mask, the source and drain regions 36 are aligned to the first dummy structure (40, 42, 41). Typically, dielectric spacers are formed to offset deep source and drain portions (portions of the source and drain regions 36 having a greater depth, not separately marked in FIG. 1) from source and drain extension regions (portions of the source and drain regions 36 having lesser depth, not separately marked in FIG. 1). The dielectric spacers include a first dielectric spacer 62 formed directly on sidewalls of the first dummy structure (40, 42, 41) and a second dielectric spacer 64 formed directly on sidewalls of the second dummy structure (50, 52, 51). The first and second dielectric spacers (62, 64) may be formed by a conformal deposition of a dielectric layer followed by an anisotropic etch such as a reactive ion etch. The first and second dielectric spacers (62, 64) comprise a dielectric material such as dielectric oxide and dielectric nitride. For example, the first and second dielectric spacers (62, 64) may comprise silicon nitride, silicon oxide, or a combination thereof.

The first dielectric material portion 40 and the second dielectric material portion 50 have the same thickness and composition. The first metal portion 42 and the second metal portion 52 have the same thickness and composition. The first dummy material portion 41 and the second dummy material portion 51 have the same thickness and composition. The first and second dielectric spacers (62, 64) comprise the same dielectric material and have the same lateral thickness as measured at portions having a pair of substantially vertical sidewalls.

The prototype field effect transistor includes the second dielectric material portion 50, the source and drain regions 36, and a body region 34, and a dummy gate electrode. The second dielectric material portion 50 is a gate dielectric of the prototype field effect transistor. The body region 34 is a remainder of a semiconductor portion after excluding the source and drain regions 36. The dummy gate electrode includes the second metal portion 52 and the second dummy material portion 51.

Optionally but preferably, various metal semiconductor alloys (not shown) may be formed to decrease contact resistance to the source and drain regions 36. Methods of forming various metal semiconductor alloys are known in the art. In case the source and drain regions 36 comprises silicon, the metal semiconductor alloy portions may comprises a metal silicide such as such as nickel silicide ($NiSi_x$), cobalt silicide ($CoSi_x$), tantalum silicide ($TaSi_x$), and titanium silicide ($TiSi_x$), tungsten silicide ($WSi_x$), platinum silicide ($PtSi_x$) or alloys thereof, in which values of x may be typically between 1 and 3.

Figure 2:
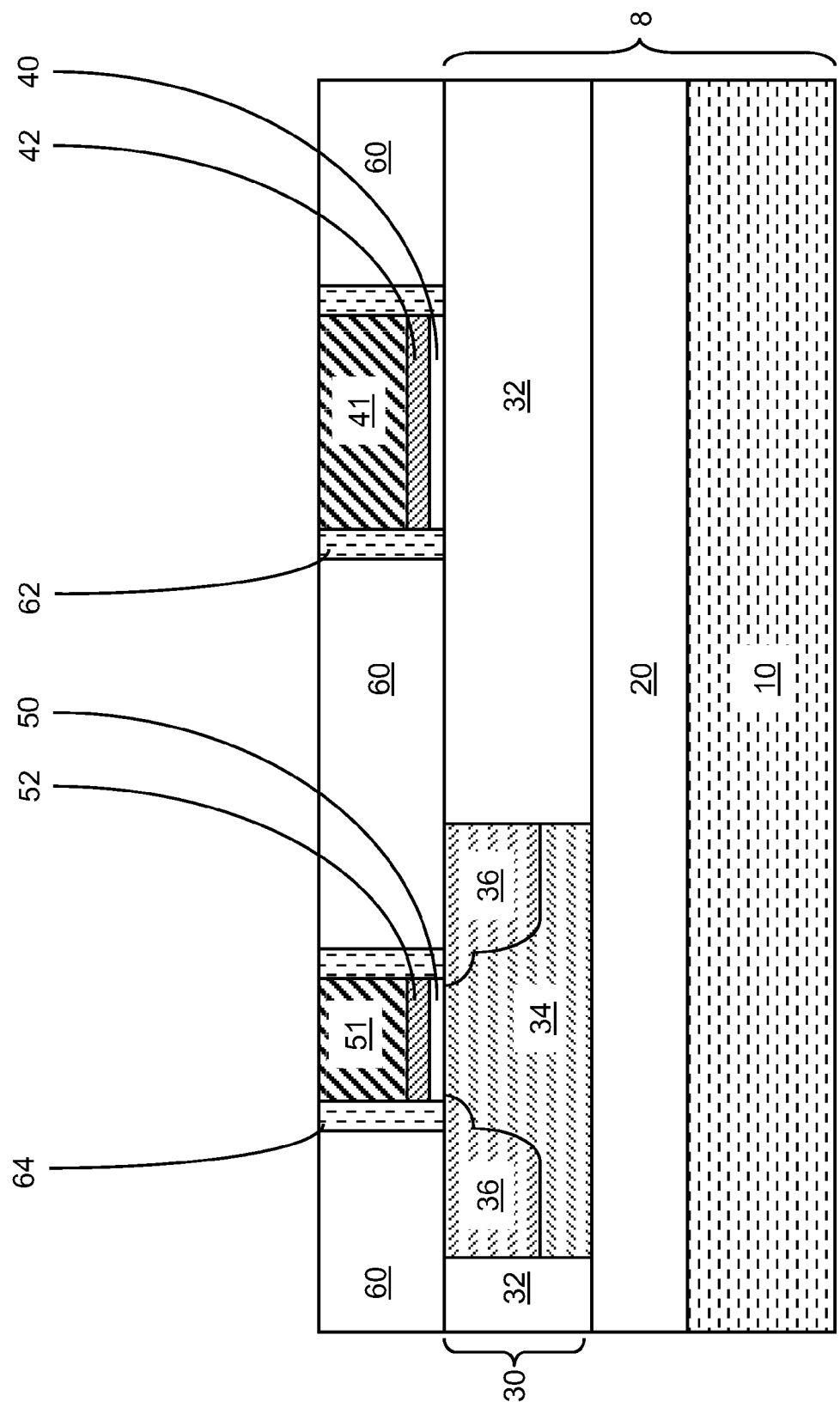
FIG. 2 is a vertical cross-sectional view of the first exemplary semiconductor structure after deposition of a gate level dielectric layer and planarization according to the first embodiment of the present invention.

Referring to FIG. 2, a gate level dielectric layer 60 is deposited over the semiconductor substrate 8, the first and second dummy structures (40, 42, 41, 50, 52, 51), and the first and second dielectric spacers (62, 64). The gate level dielectric layer 60 is a dielectric layer that is formed in the "gate level," i.e., a level at which gate electrodes of field effect transistors are formed. The gate level dielectric layer 60 may comprise, for example, a CVD oxide. The CVD oxide may be an undoped silicate glass (USG), borosilicate glass (BSG), phosphosilicate glass (PSG), fluorosilicate glass (FSG), borophosphosilicate glass (BPSG), organosilicate glass (OSG or SiCOH dielectric), or a combination thereof. Alternately, the gate level dielectric layer 60 may be a self-planarizing material such as a spin-on glass (SOG) or a spin-on low-k dielectric material such as SiLK™.

The thickness of the gate level dielectric layer 60 is greater than the height of the first and second dummy structures (40, 42, 41, 50, 52, 51), and may be from about 200 nm to about 500 nm. Alternately, the gate level dielectric layer 60 may comprise an organosilicate glass (OSG) having a dielectric constant value of less than 2.8.

The gate level dielectric layer 60 is preferably planarized, for example, by chemical mechanical polishing (CMP). Upper portions of the first and second dummy material portions (41, 51) and the first and second dielectric spacers (62, 64) may be removed during the planarization. The first and second dummy material portions (41, 51) may provide an end point signal during the planarization process. At the end of the planarization, a horizontal planar surface is formed, on which the top surfaces of the first and second dummy material portions (41, 51), the first and second dielectric spacers (62, 64), and the gate level dielectric layer 60 are exposed.

Figure 3:
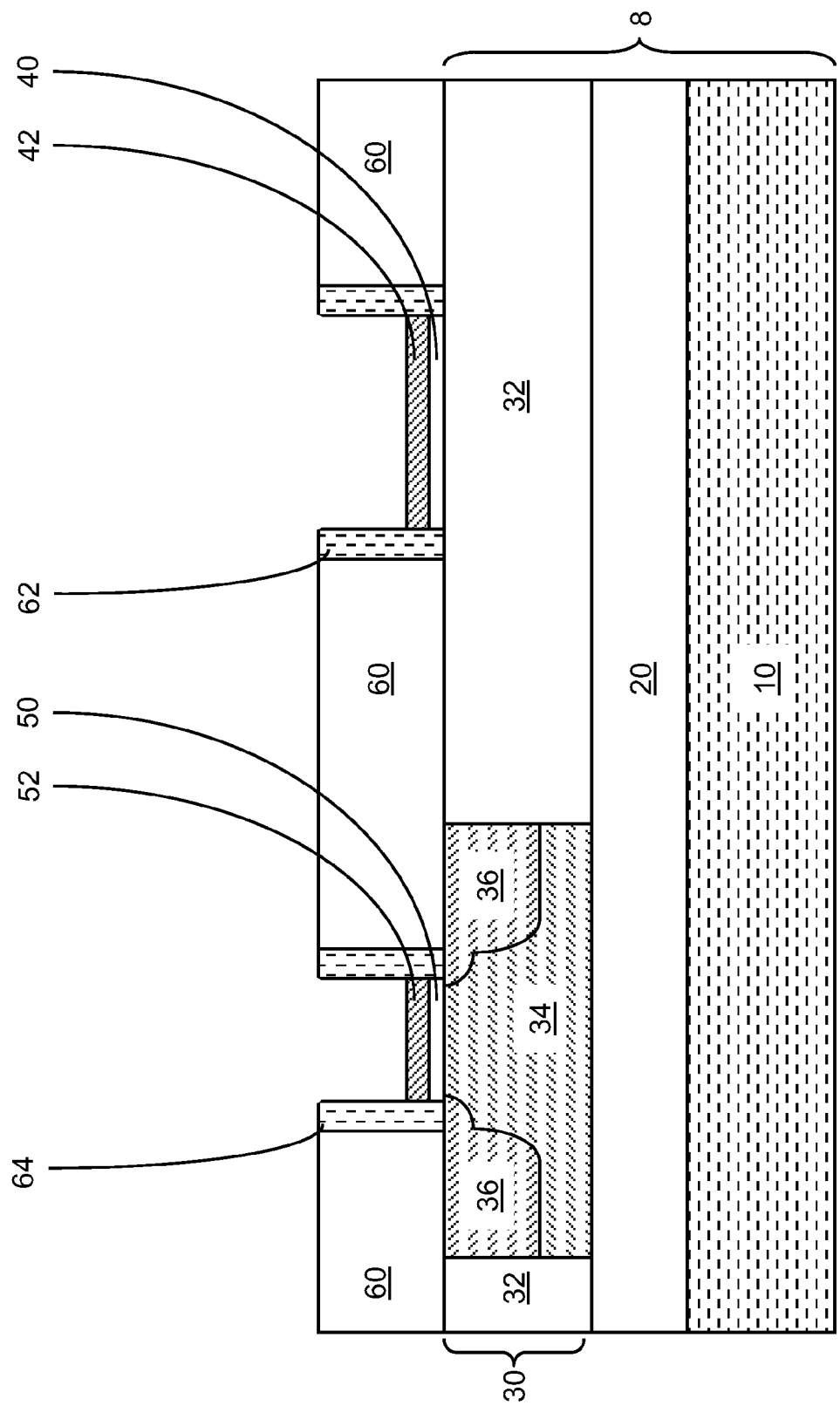
FIG. 3 is a vertical cross-sectional view of the first exemplary semiconductor structure after removal of an upper portion of the dummy structures according to the first embodiment of the present invention.

Referring to FIG. 3, the first and second dummy material portions (41, 51) are removed selective to the gate level dielectric layer 60 and the first and second dielectric spacers (62, 64). In one case, the removal of the first and second dummy material portions (41, 51) is selective to the first and second metal portions (42, 52). In another case, first and second metal portions (42, 52) are removed selective to the first and second dielectric material portions (40, 50). Alternately, the first and second dielectric material portions (40, 50) may be removed and equivalent or functionally superior dielectric material portions comprising another high dielectric constant material may be formed. Thus, a first recessed area is formed over the first dielectric material portion 40 and/or the first metal portion 42 within the gate level dielectric layer 60. Likewise, a second recessed area is formed over the second dielectric material portion 50 and/or the second metal portion 52 within the gate level dielectric layer 60.

Figure 4:
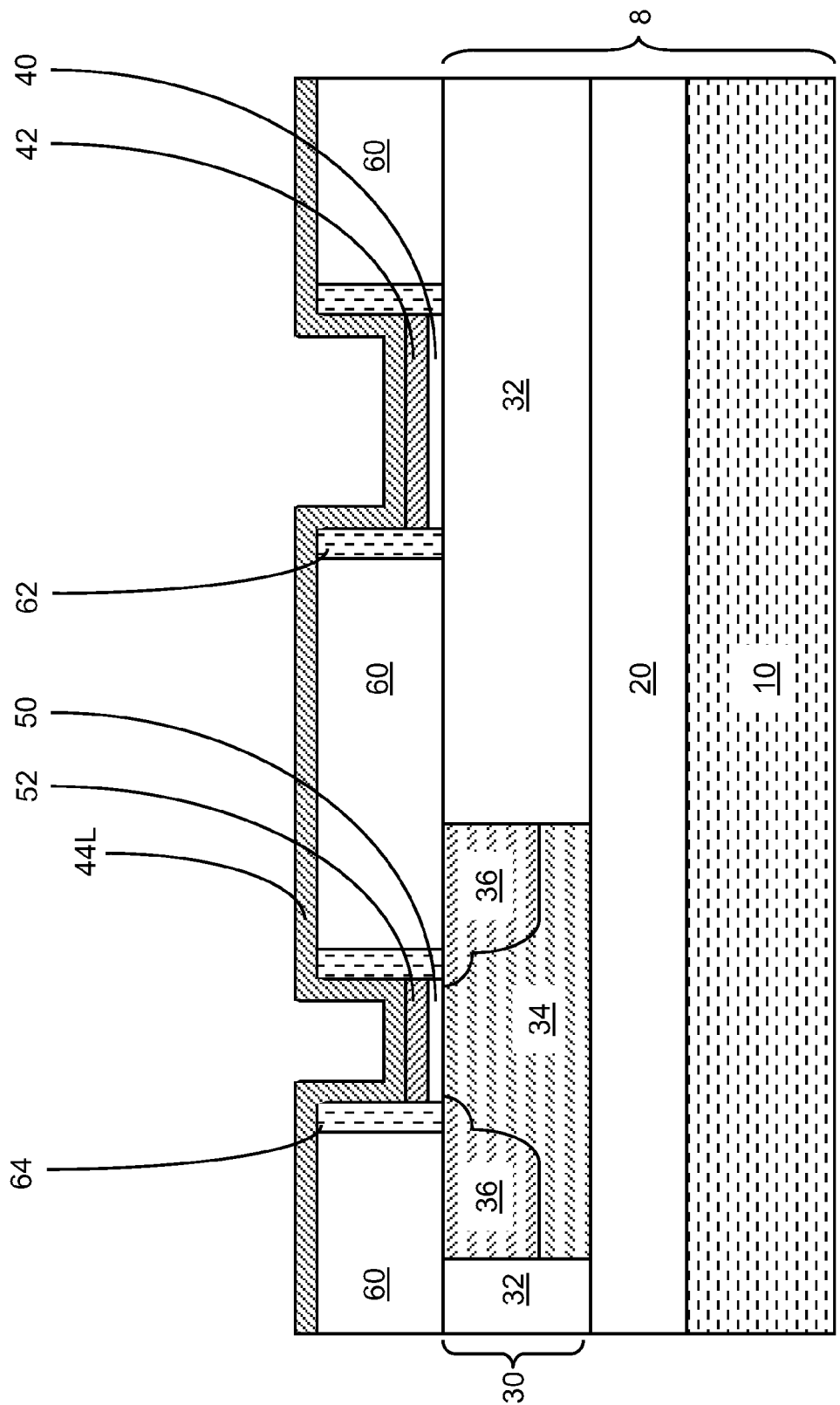
FIG. 4 is a vertical cross-sectional view of the first exemplary semiconductor structure after deposition of a first conductive material layer according to the first embodiment of the present invention.

Referring to FIG. 4, a first conductive material layer 44L is formed on exposed surfaces of the first exemplary semiconductor structure including the top surface of the gate level dielectric layer 60, the top surfaces and sidewall surfaces of the first and second dielectric spacers (62, 64), and the top surfaces of the first and second metal portions (42, 52) or the first and second dielectric material portions (40, 50) within the recesses areas. The first conductive material layer 44L comprises a conductive material such as a metal, a conductive metallic nitride, or a combination thereof. For example, the first conductive material layer 44L may comprise a conductive metallic nitride such as TiN, TaN, WN, or a combination thereof. The thickness of the first conductive material layer 44L may be from 5 nm to 50 nm, although lesser and greater thicknesses are also contemplated herein. The first conductive material layer 44L may be formed, for example, by chemical vapor deposition (CVD), physical vapor deposition (PVD), atomic layer deposition (ALD), etc.

Figure 5:
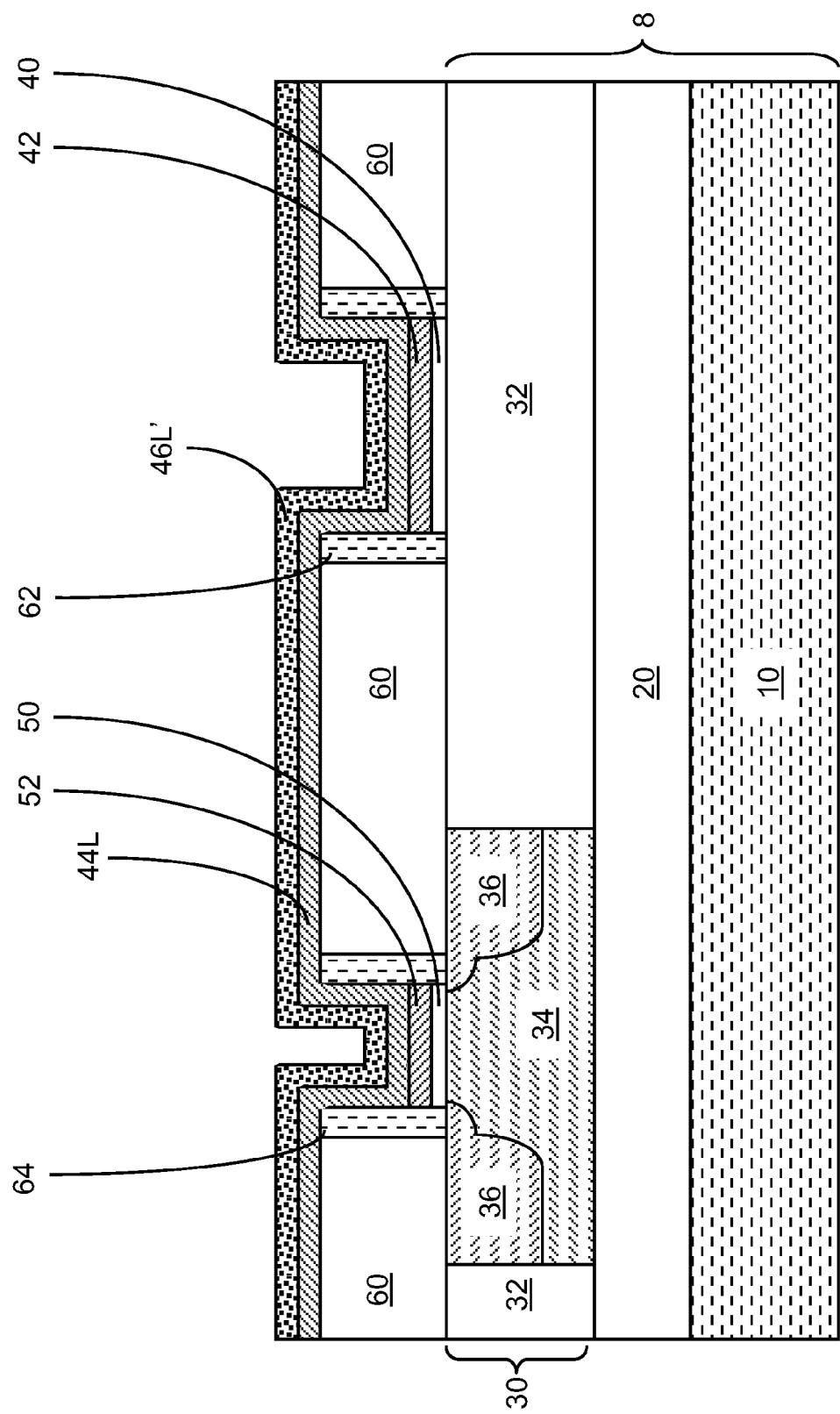
FIG. 5 is a vertical cross-sectional view of the first exemplary semiconductor structure after deposition of a dielectric metal oxide layer according to the first embodiment of the present invention.

Referring to FIG. 5, a dielectric metal oxide layer 46L' is formed directly on the first conductive material layer 44L. The dielectric metal oxide layer 46L' includes a dielectric metal oxide material having different resistivity between an amorphous state and a crystallized state. While most amorphous dielectric metal oxide materials have a high resistivity on the order of $1.0 \times 10^{14}$ Ohm-cm in an amorphous state, crystalline dielectric metal oxide materials have lesser resistivity, or greater conductivity, than the amorphous dielectric metal oxide materials having the same composition. Such change in the resistivity of the dielectric metal oxide materials may be greater than a factor of 3, and in some cases, may be greater than one order of magnitude (a factor of 10). Non-limiting examples of the dielectric metal oxide material that may be employed in the present invention include titanium oxide, zirconium oxide, tantalum oxide, and niobium oxide.

The material of the dielectric metal oxide layer 46L' is deposited in an amorphous state. The dielectric metal oxide layer 46L' may be formed by methods well known in the art including, for example, chemical vapor deposition (CVD), atomic layer deposition (PVD), molecular beam epitaxy (MBE), pulsed laser deposition (PLD), liquid source misted chemical deposition (LSMCD), etc. The thickness of the dielectric metal oxide layer 46L' may be from 1 nm to 50 nm, and preferably from 2 nm to 10 nm, although lesser and greater thicknesses are also contemplated herein.

Figure 6:
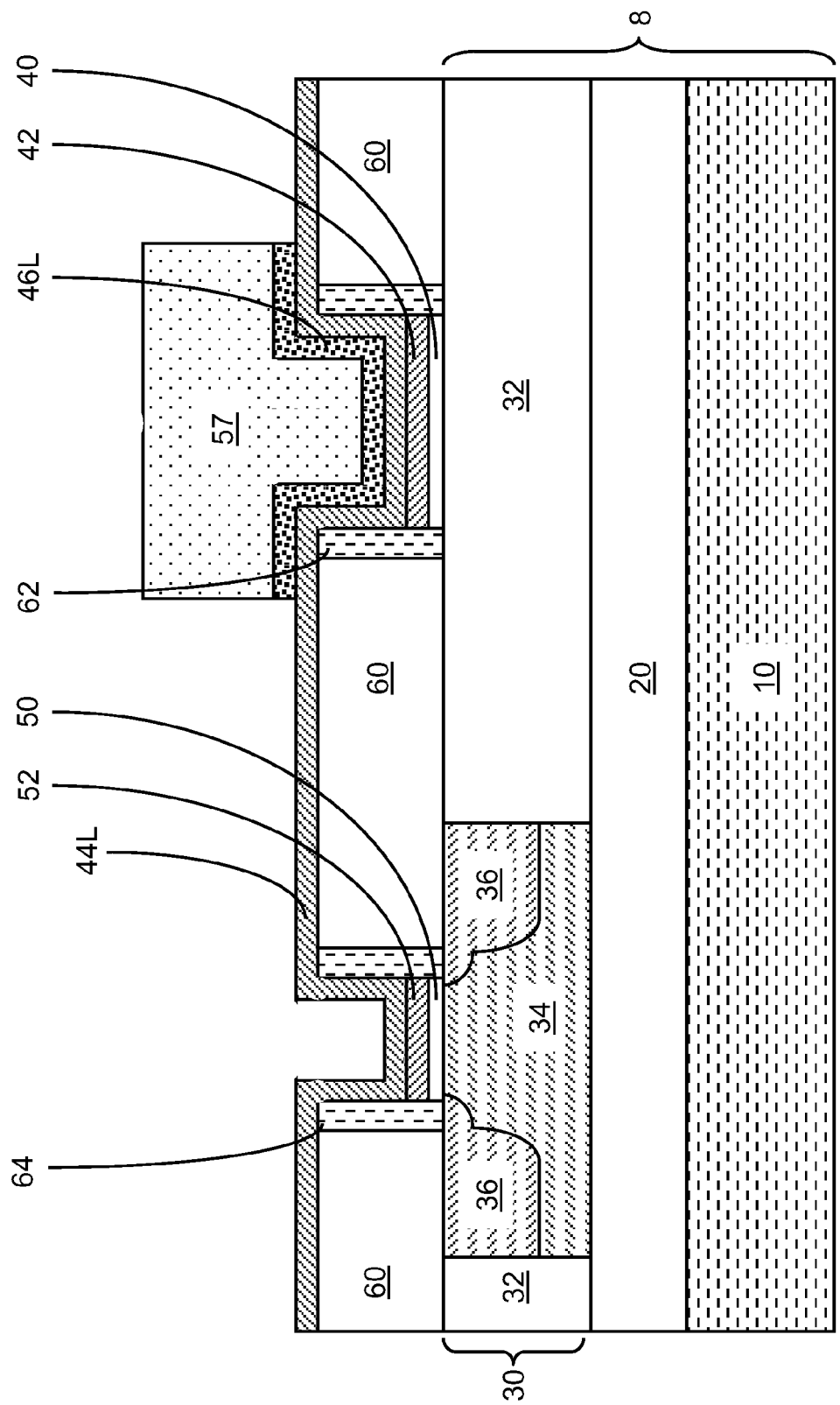
FIG. 6 is a vertical cross-sectional view of the first exemplary semiconductor structure after lithographic patterning of the dielectric metal oxide layer according to the first embodiment of the present invention.

Referring to FIG. 6, the dielectric metal oxide layer 46L' is patterned to form a patterned dielectric metal oxide layer 46 that is present over the first dielectric material portion 40, while the patterned dielectric metal oxide layer 46 is not present over the second dielectric material portion 50. Lithographic patterning may be performed employing a first photoresist 57. In this case, the first photoresist 57 is patterned to mask the dielectric metal oxide layer 46L' over the first recess area above the first dielectric material portion 40, while exposing the dielectric metal oxide layer 46L' over the second recess area above the second dielectric material portion 50. An isotropic etch or an anisotropic etch is employed to remove the exposed portions of the dielectric metal oxide layer 46L' selective to the first conductive material layer 44L employing the first photoresist 57 as an etch mask. The first photoresist 57 is subsequently removed, for example, by ashing.

Figure 7:
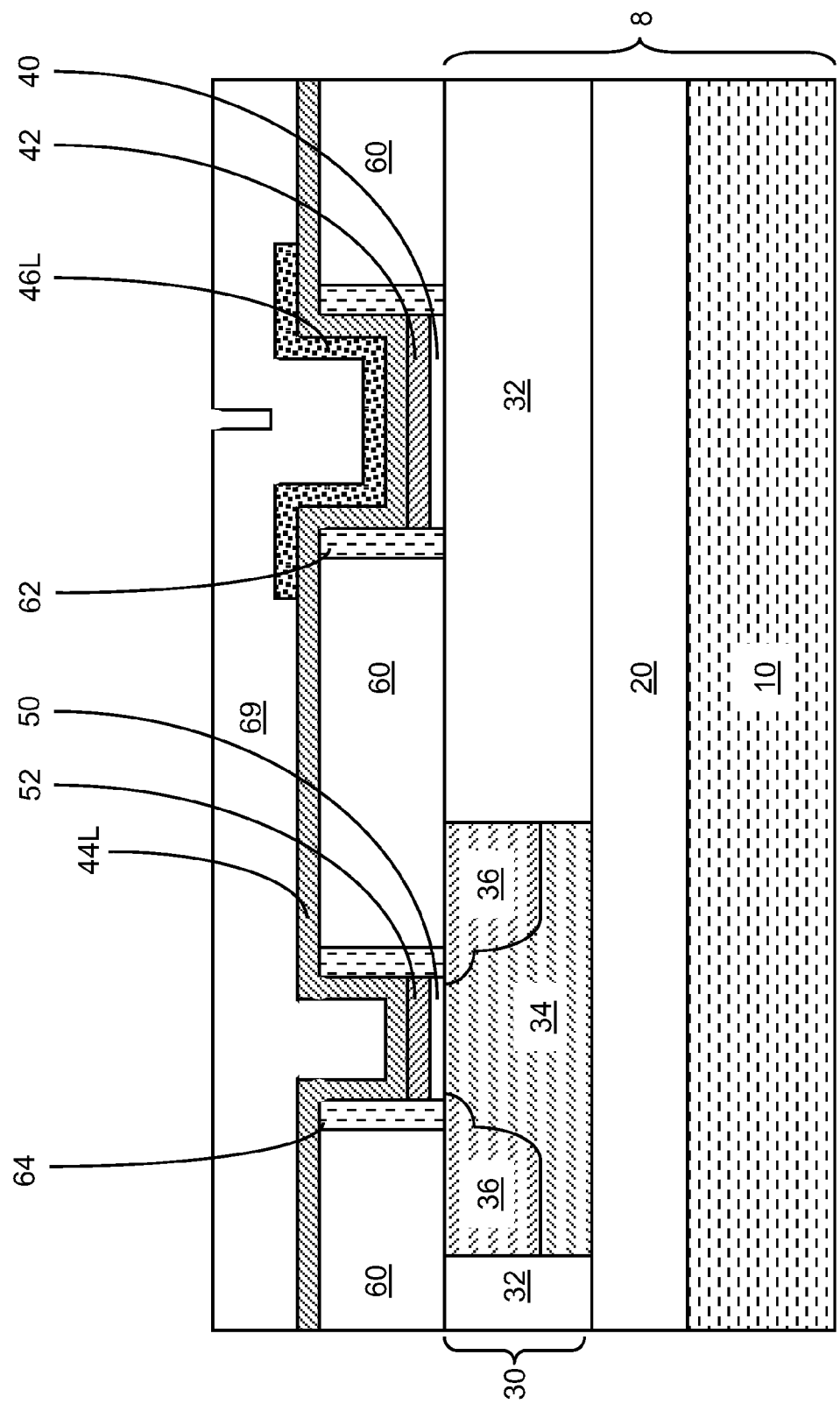
FIG. 7 is a vertical cross-sectional view of the first exemplary semiconductor structure after deposition of a planarization dielectric layer according to the first embodiment of the present invention.

Referring to FIG. 7, a second dielectric layer 69 is formed directly on the first conductive material layer 44 and the patterned dielectric metal oxide layer 46, which is a remaining portion of the dielectric metal oxide layer 46. The second dielectric layer 69 is a planarization dielectric layer, i.e., a dielectric layer that is subsequently planarized. The second dielectric layer 69 comprises a dielectric material that may be planarized such as silicon oxide or silicon nitride. The second dielectric layer 69 may, or may not, completely fill the first or second recess area. The thickness of the second dielectric layer 69 may be from 10 nm to 200 nm, although lesser and greater thicknesses are also contemplated herein. The second dielectric layer 69 may be formed, for example, by chemical vapor deposition or spin coating.

Figure 8:
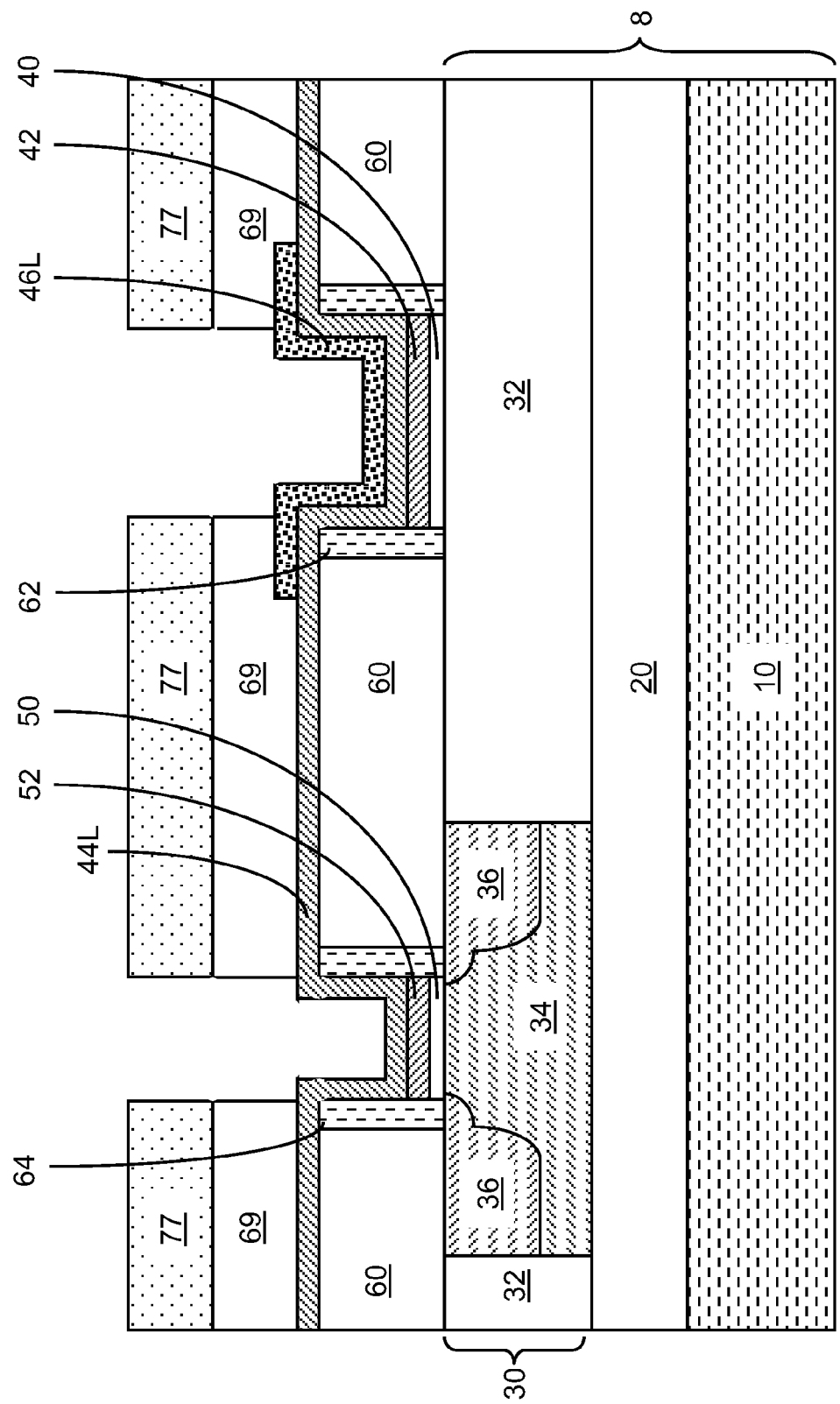
FIG. 8 is a vertical cross-sectional view of the first exemplary semiconductor structure after patterning of the planarization dielectric layer according to the first embodiment of the present invention.

Referring to FIG. 8, a second photoresist 77 is applied over the top surface of the second dielectric layer 69 and is lithographically patterned to form openings in an area in which deposition of metal is desired. An anisotropic etch is performed employing the second photoresist 77 to remove the exposed portions of the second dielectric layer 69 selective to the patterned dielectric metal oxide layer 46L and the first conductive material layer 44L. At least a portion of the patterned dielectric metal oxide layer 46L is exposed from within the first recess area over the first dielectric material portion 40. Further, at least a portion of the first conductive material layer 44L is exposed with the second recess area over the second dielectric material portion 50. The second photoresist 77 is subsequently removed.

Figure 9:
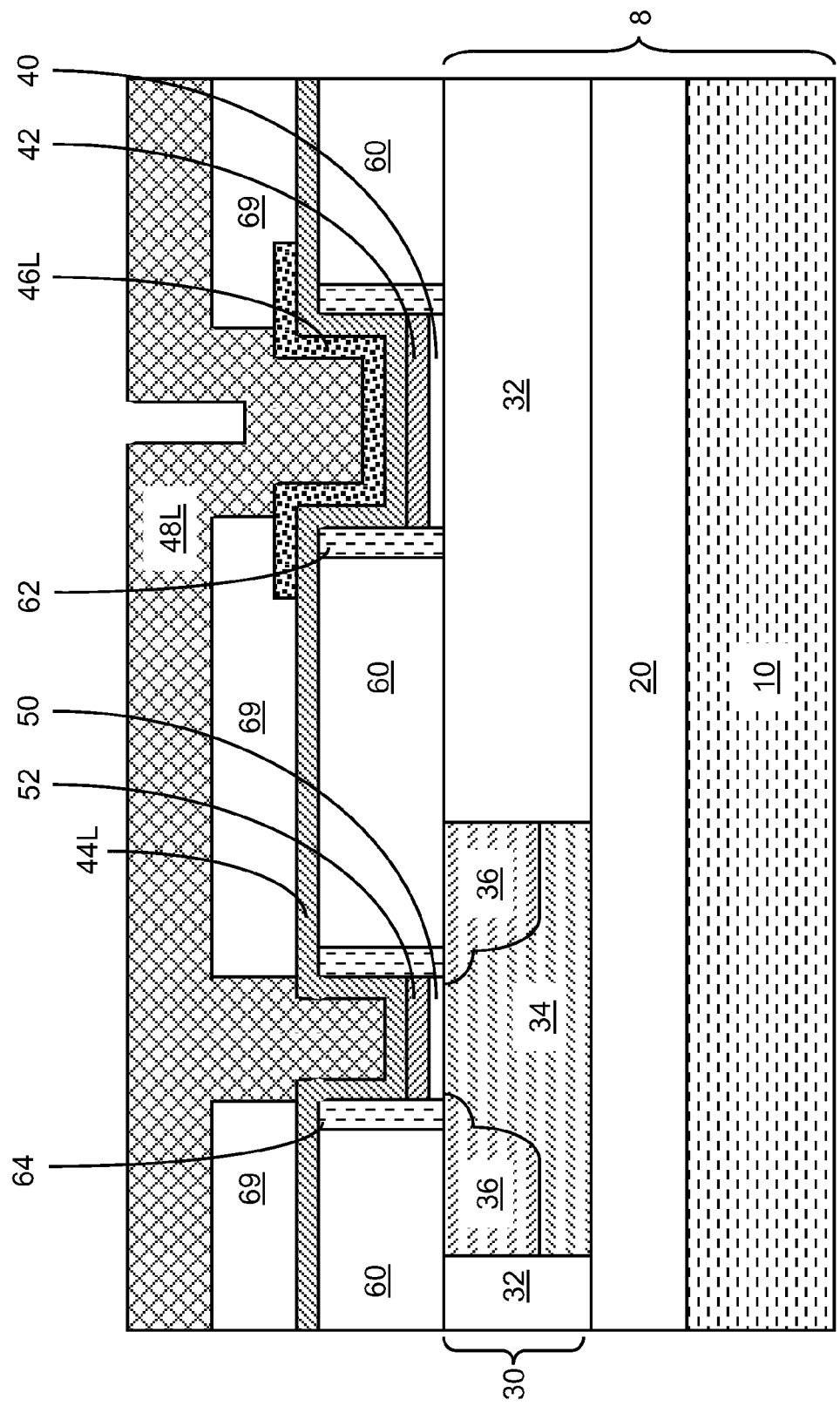
FIG. 9 is a vertical cross-sectional view of the first exemplary semiconductor structure after deposition of a second conductive material layer according to the first embodiment of the present invention.

Referring to FIG. 9, a second conductive material layer 48L is formed within the first and second recessed areas and above the top surface of the second dielectric layer 69. The second conductive material layer 48L comprises a conductive material such as a metal, a conductive metallic nitride, or a combination thereof. For example, the second conductive material layer 48L may comprise a conductive elemental metal such as W, Ti, or Ta. The second conductive metal layer 48L completely fills the first and second recesses at least up to the level of the top surface of the first conductive layer 44L above the gate level dielectric layer 60. Typically, the thickness of the second conductive material layer 48L is from 20 nm to 200 nm, although lesser and greater thicknesses are also contemplated herein. The second conductive material layer 48L may be formed, for example, by chemical vapor deposition (CVD), physical vapor deposition (PVD), atomic layer deposition (ALD), etc.

Figure 10:
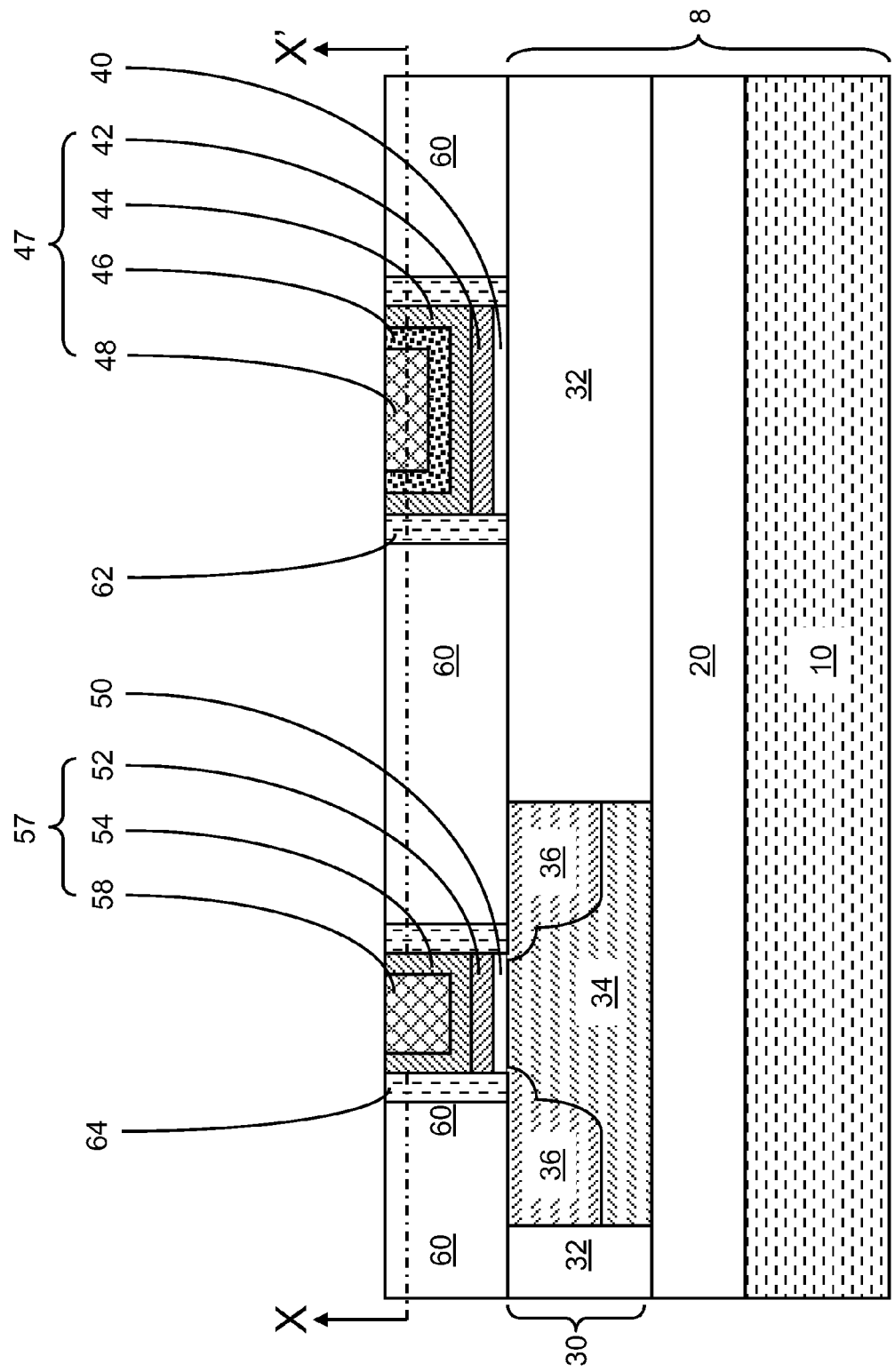
FIG. 10 is a vertical cross-sectional view of the first exemplary semiconductor structure after planarization of the second conductive material layer and the planarization dielectric layer according to the first embodiment of the present invention.

Referring to FIG. 10, the first exemplary semiconductor structure is planarized to remove the material above the top surface of the gate level dielectric layer 60. Thus, the portion of the second conductive material layer 48L above the top surface of the gate level dielectric layer 60, all of the second dielectric layer 69, and the portion of the patterned dielectric metal oxide layer 46L above the top surface of the gate level dielectric layer 60 are removed by planarization.

After planarization, the remaining portion of the second conductive material layer 48L located above the first dielectric material portion 40 and within the first recessed area constitutes an inner conductive material portion 48. The remaining portion of the patterned dielectric metal oxide layer 46L within the first recessed area constitutes a dielectric metal oxide portion 46. The remaining portion of the first conductive material layer 44L within the first recessed area constitutes an outer conductive material portion 44. The topmost surface of the outer conductive material portion 44 is substantially coplanar with the top surface of the gate level dielectric layer 60, the top surface of the dielectric metal oxide portion 46, the top surface of the first dielectric spacer 62, and the top surface of the inner conductive material portion 48.

An electrical antifuse 47 includes the inner conductive material portion 48, the dielectric metal oxide portion 46, and the outer conductive material portion 44. The dielectric metal oxide portion 46 laterally abuts and encloses the inner conductive material portion 48. The outer conductive material portion 44 laterally abuts and encloses the dielectric metal oxide portion 46. The outer conductive material portion 44 is separated from the inner conductive material portion 48 by the dielectric metal oxide portion 46. The first metal portion 42 may be present directly beneath the bottom surface of the outer conductive material portion 44. The first dielectric material portion 40 is located beneath the outer conductive material portion 44.

After planarization, the remaining portion of the second conductive material layer 48L located above the second dielectric material portion 50 and within the second recessed area constitutes an inner gate conductor portion 58. The remaining portion of the first conductive material layer 44L within the second recessed area constitutes an outer gate conductor portion 54. The topmost surface of the outer gate conductor portion 54 is substantially coplanar with the top surface of the gate level dielectric layer 60, the top surface of the second dielectric spacer 62, and the top surface of the inner gate conductor portion 58.

A field effect transistor includes the source and drain regions 36, the body region 35, and the second dielectric material portion 50, which functions as a gate dielectric, and a gate conductor 57 that includes the inner gate conductor portion 58 and the outer gate conductor portion 54. If gate conductor also includes the second metal portion 52, if present.

The inner gate conductor portion 58 and the inner conductive material portion 48 have the same material, and the outer gate conductor portion 54 and the outer conductive material portion 44 have the same composition. The second dielectric material portion 50 and the first dielectric material portion 40 have the same composition.

Figure 11:
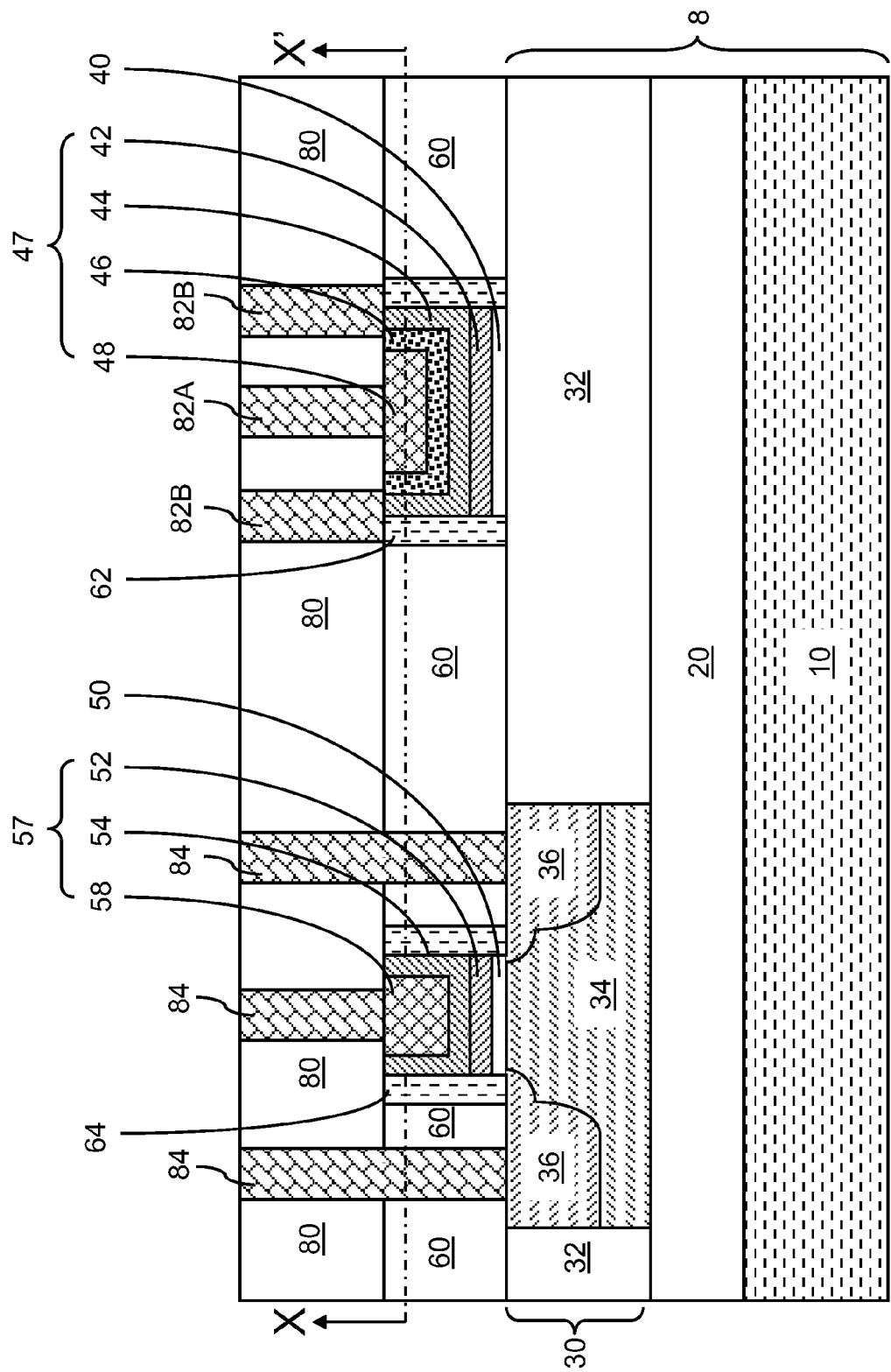
FIG. 11 is a vertical cross-sectional view of the first exemplary semiconductor structure after formation of a contact level dielectric layer and conductive contacts according to the first embodiment of the present invention.
Figure 12:
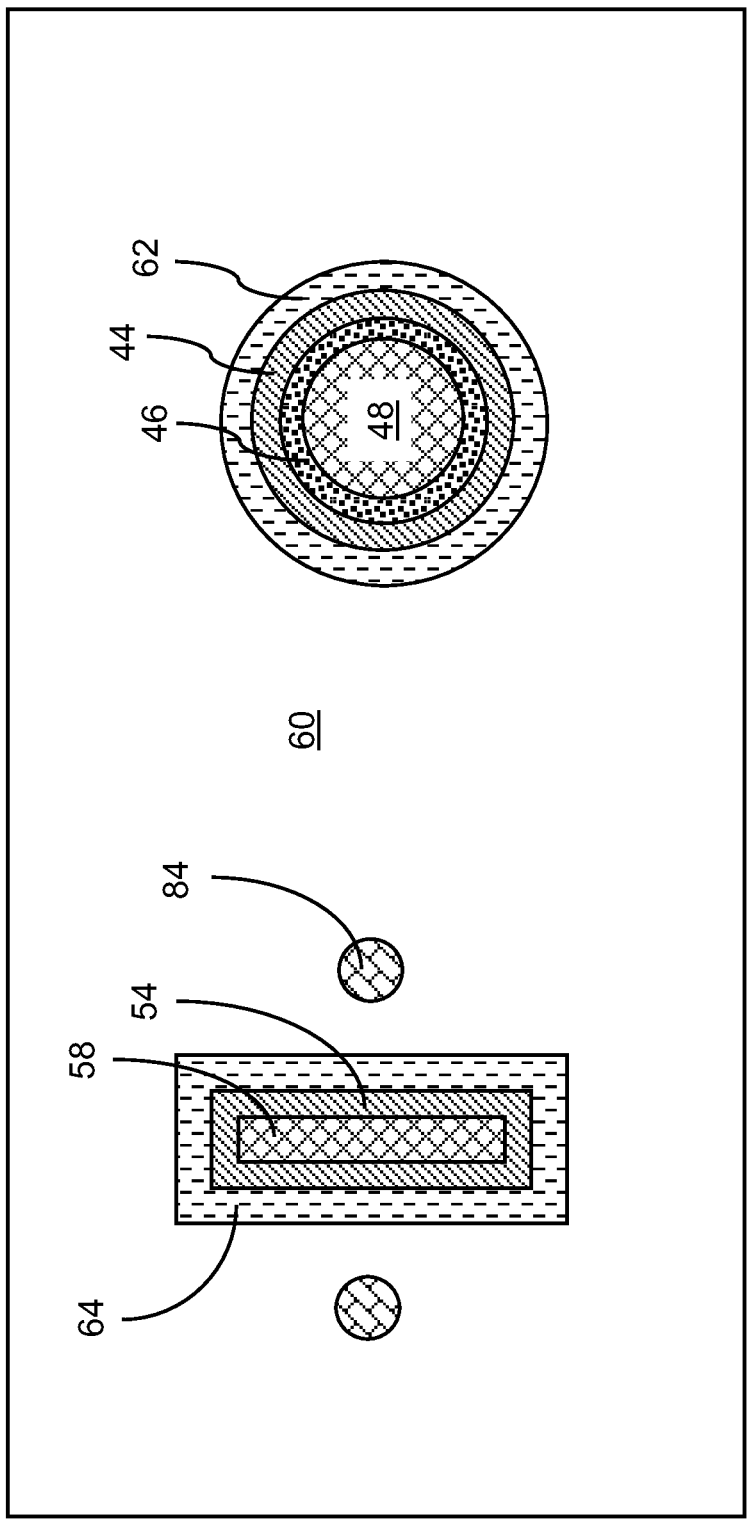
FIG. 12 is a horizontal cross-sectional view of the first exemplary semiconductor structure of FIG. 11 along the plane X-X' according to the first embodiment of the present invention.

Referring to FIGS. 11 and 12, a contact level dielectric layer 80 is deposited over the top surfaces of the gate conductor (52, 54, 58), the electrical antifuse (44, 46, 48), and the gate level dielectric layer 60. The contact level dielectric layer 80 is a dielectric layer formed in contact level, i.e., the level that includes contact vias to devices. The contact level dielectric layer 80 comprises a dielectric material, which may be, for example, a CVD oxide. The CVD oxide may be an undoped silicate glass (USG), borosilicate glass (BSG), phosphosilicate glass (PSG), fluorosilicate glass (FSG), borophosphosilicate glass (BPSG), organosilicate glass (OSG or SiCOH dielectric), or a combination thereof. Alternately, the contact level dielectric layer 80 may be a self-planarizing material such as a spin-on glass (SOG) or a spin-on low-k dielectric material such as SiLK™.

Various contact via holes are formed in the contact level dielectric layer 80 and filled with metal to from various contact vias. Specifically, a pair of conductive contacts 82B is formed directly on the outer conductive material portion 44. Further, another conductive contact 82A is formed directly on the inner conductive material portion 48. Additional contact vias 84 may be formed to provide electrical contact to other device components such as the gate conductor 57 and the source and drain regions 36 of the field effect transistor.

Preferably, the first exemplary semiconductor structure includes a semiconductor device (not shown) configured to provide electrical current through the outer conductive material portion 44 of the electrical antifuse 47. In this case, the electrical current flows from one of the pair of conductive contacts 82B, through the inner conductive material portion 48, and then through the other of the pair of conductive contacts 82B. When the electrical current is passed through the inner conductive material portion 48, the amorphous dielectric metal oxide material in the dielectric metal oxide portion 46 is heated and transformed into crystalline dielectric metal oxide material having lesser resistivity. Thus, the electrical antifuse 47 of the present invention is programmed by altering the microstructure of the dielectric metal oxide portion 46 from an amorphous state to a crystalline state.

The state of the dielectric metal oxide portion 46 stores information on whether the electrical antifuse 47 is programmed or not. To sense whether the electrical antifuse 47 is programmed or not, i.e., to sense whether the electrical antifuse 47 stores "0" or "1," electrical current is passed through the another conductive contact 82A, the inner conductive material portion 48, the dielectric metal oxide portion 46, the outer conductive material portion 44, and at least one of the pair of conductive contacts 82B. A sensing device (not shown), which is configured to measure this electrical current or the corresponding voltage differential across the electrical antifuse 47, determines the state of the electrical antifuse 47 depending on the level of the electrical current or the voltage. Preferably, the sensing device is also formed on the semiconductor substrate 8. The sensing device may be any type of sensing circuit such as a differential sensing circuit that compares voltage differential or current relative to a reference circuit including a reference element that provides a threshold voltage drop or a threshold current for the purposes of sensing.

Figure 13:
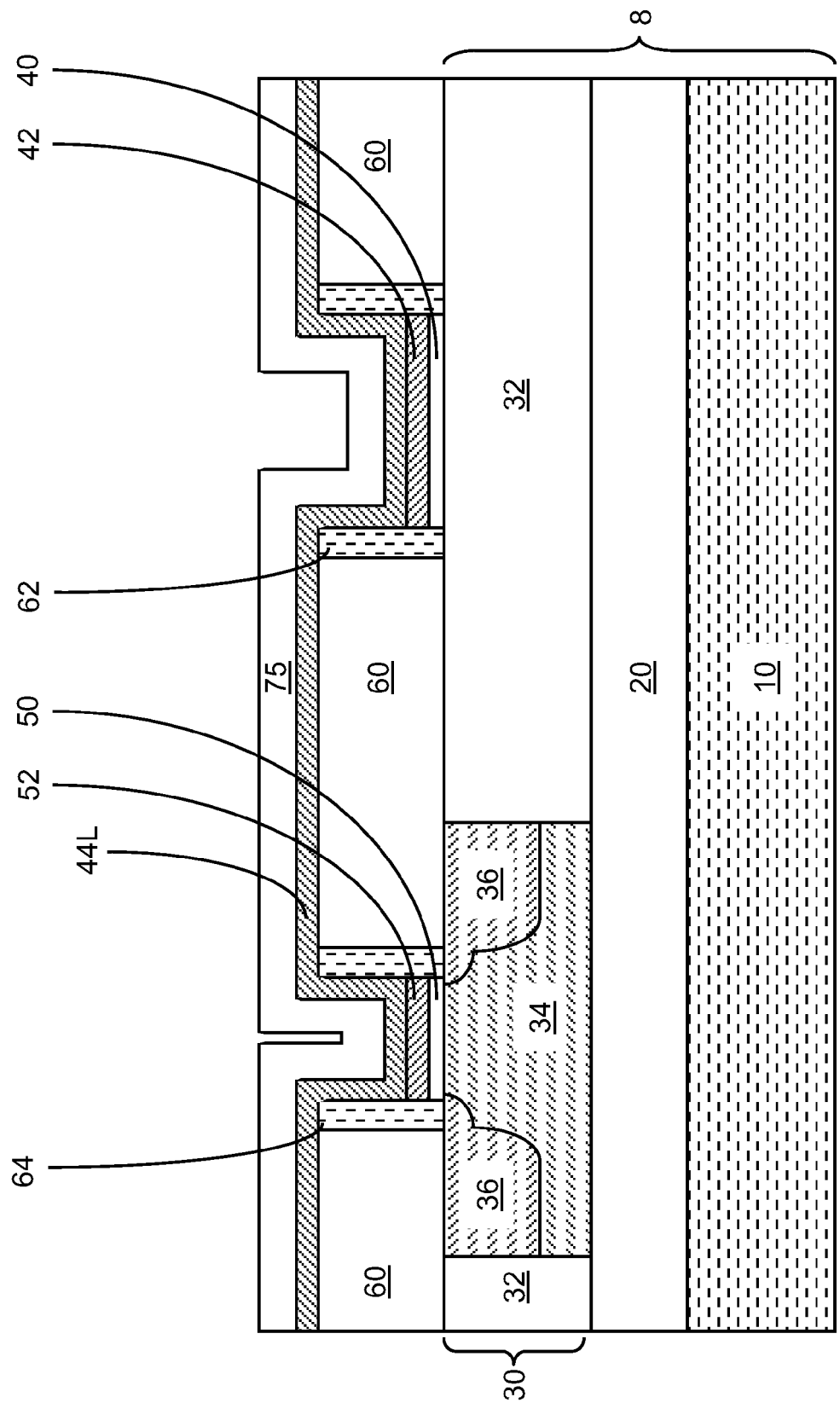
FIG. 13 is a vertical cross-sectional view of a second exemplary semiconductor structure after formation of a planarization dielectric layer according to a second embodiment of the present invention.

Referring to FIG. 13, a second exemplary semiconductor structure of the present invention is derived from the first exemplary semiconductor structure of FIG. 4 by depositing a second dielectric layer 75 directly on the first conductive material layer 44L. The second dielectric layer 75 is a planarization dielectric layer, i.e., a dielectric layer that is subsequently planarized. The second dielectric layer 75 comprises a dielectric material that may be planarized such as silicon oxide or silicon nitride. The second dielectric layer 75 may, or may not, completely fill the first or second recess area. The thickness of the second dielectric layer 75 may be from 10 nm to 200 nm, although lesser and greater thicknesses are also contemplated herein. The second dielectric layer 75 may be formed, for example, by chemical vapor deposition or spin coating.

Figure 14:
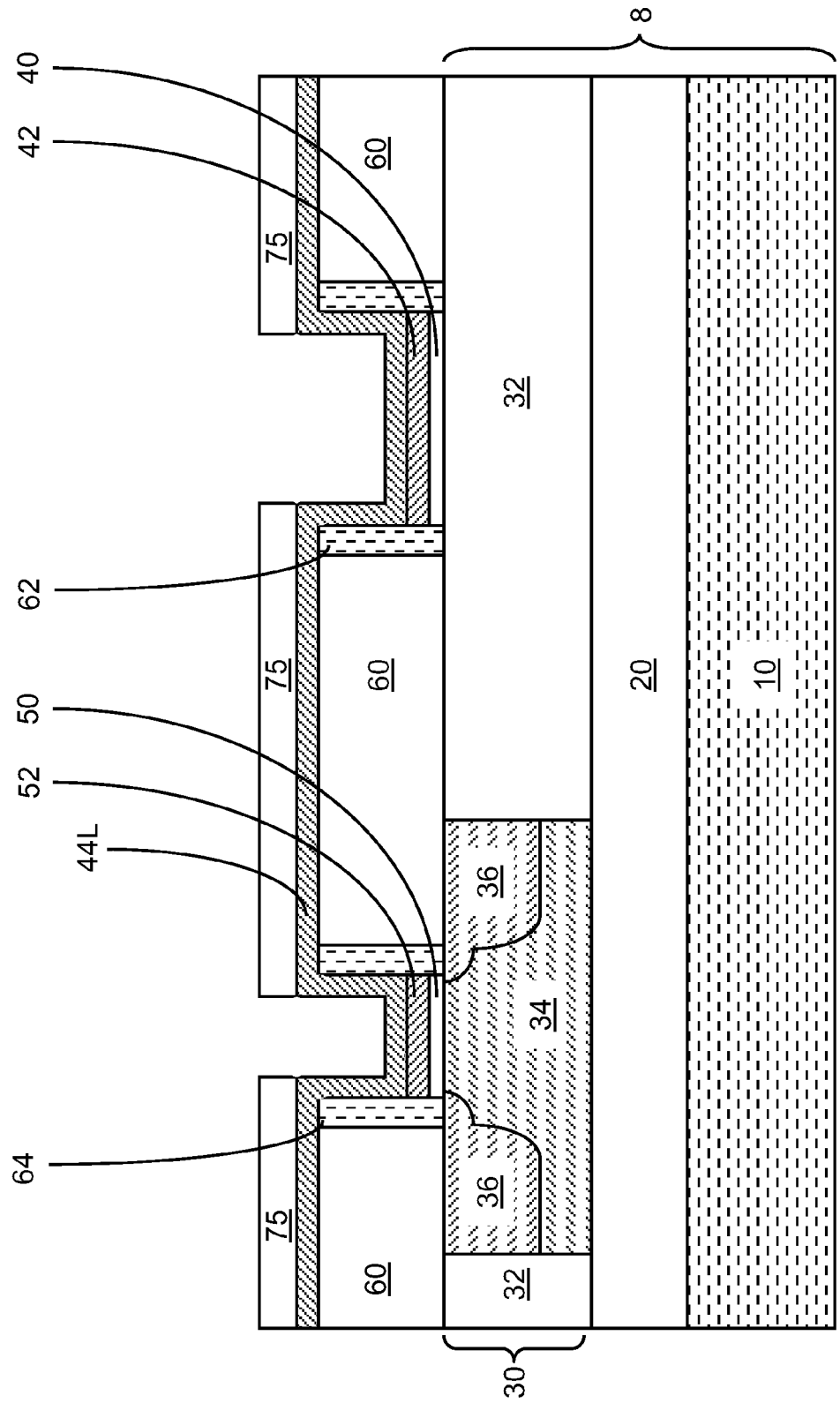
FIG. 14 is a vertical cross-sectional view of the second exemplary semiconductor structure after patterning of the planarization dielectric layer according to the second embodiment of the present invention.

Referring to FIG. 14, the second dielectric layer 75 is patterned to expose a portion of the first conductive material layer 44L within the first recess over the first dielectric material portion 40 and another portion of the first conductive material layer 44L within the second recess over the second dielectric material portion 50. The patterning of the second dielectric layer 75 may be effected employing a lithographically patterned photoresist (not shown) and an etch that removes exposed portions of the second dielectric layer employing the patterned photoresist as an etch mask. The patterned photoresist is subsequently removed.

Figure 15:
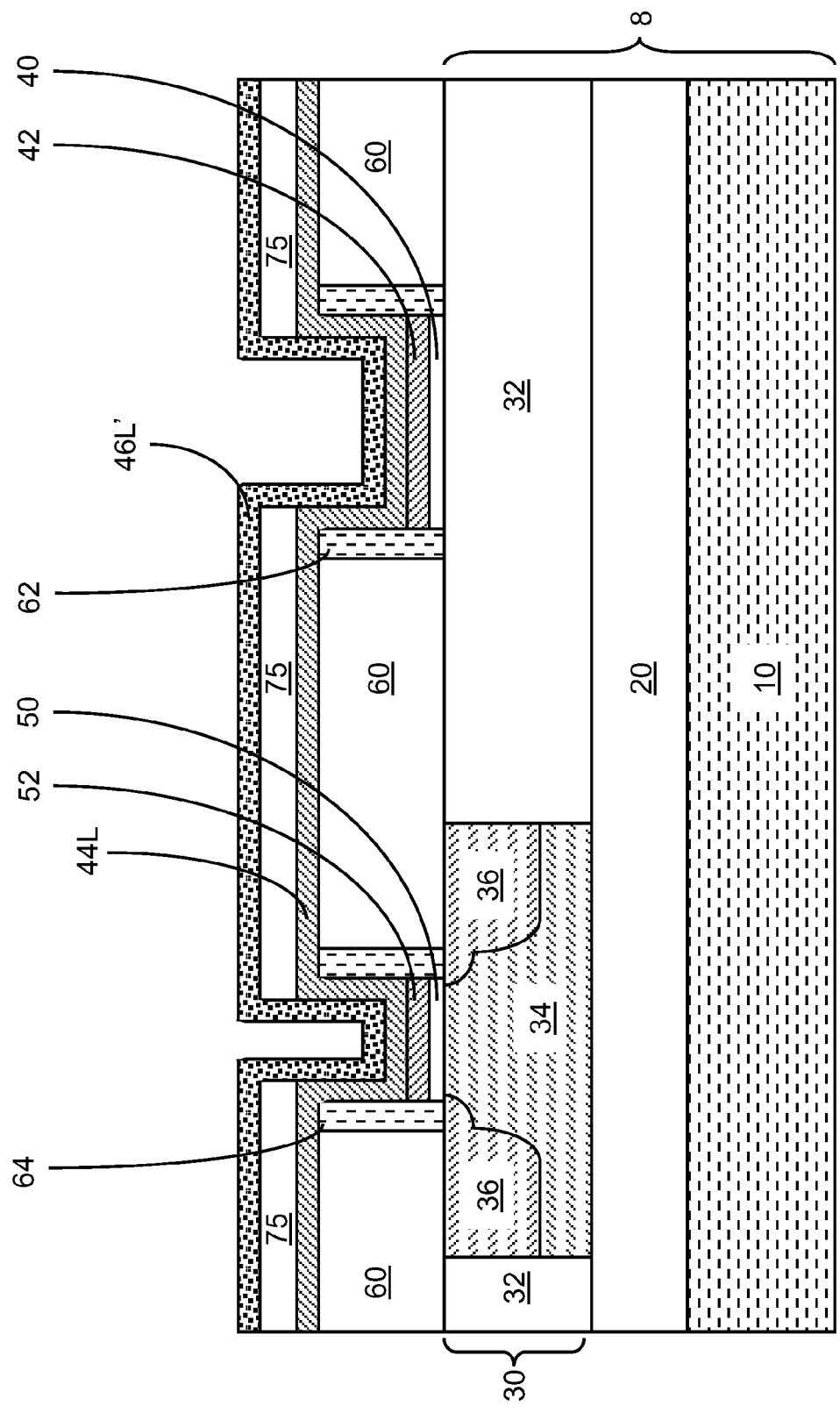
FIG. 15 is a vertical cross-sectional view of the second exemplary semiconductor structure after formation of a dielectric metal oxide layer according to the second embodiment of the present invention.

Referring to FIG. 15, a dielectric metal oxide layer 46L' is formed directly on exposed portions of the first conductive material layer 44L and the second dielectric layer 75. The dielectric metal oxide layer 46L may have the same composition and thickness, and may be formed by the same methods, as in the first embodiment.

Figure 16:
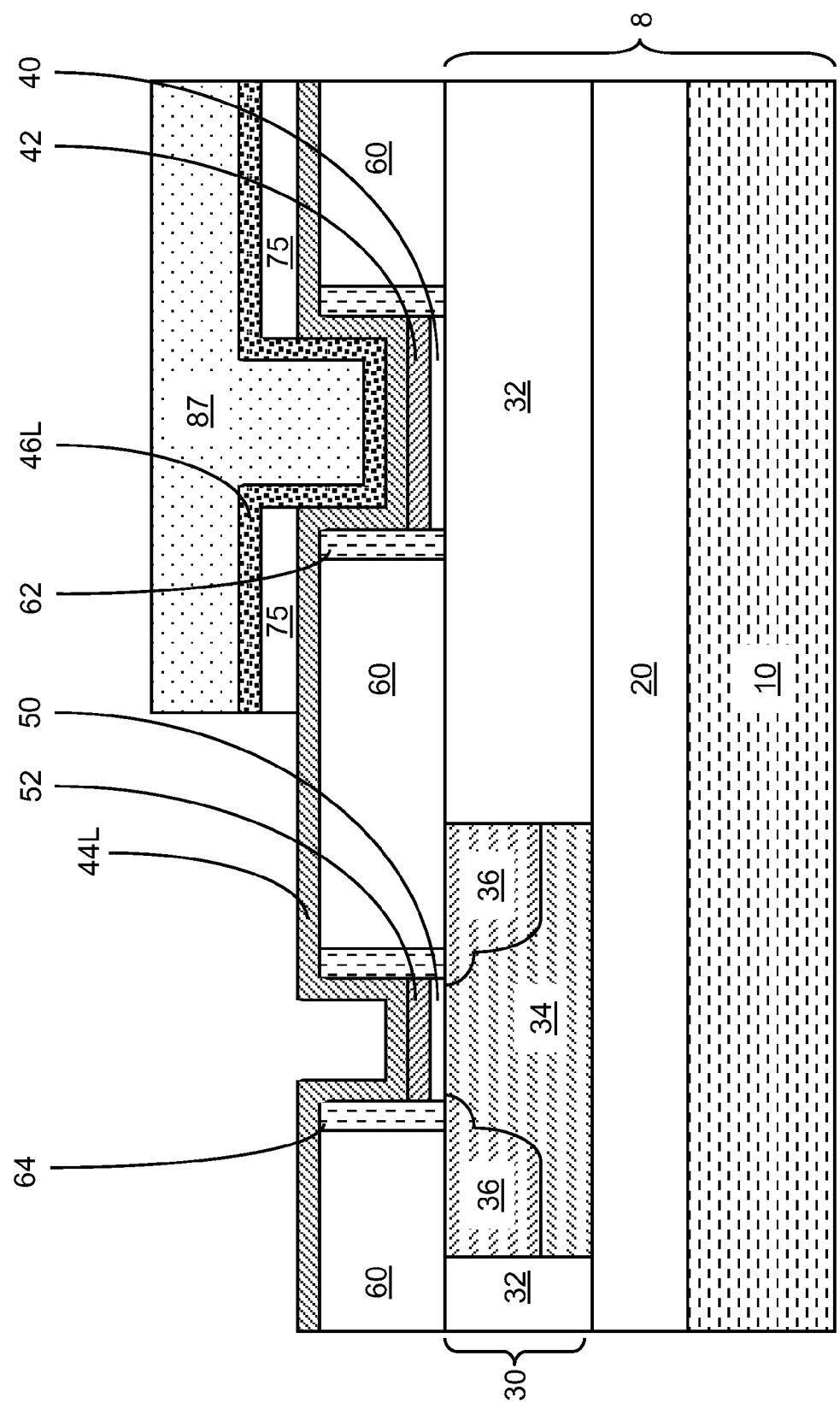
FIG. 16 is a vertical cross-sectional view of the second exemplary semiconductor structure after patterning of the dielectric metal oxide layer and the planarization dielectric layer according to the second embodiment of the present invention.

Referring to FIG. 16, the dielectric metal oxide layer 46L' and the second dielectric layer 75 are patterned, for example, by employing lithographic methods and an etch. For example, a photoresist 87 may be applied and lithographically patterned to cover an area including the first recessed area, while exposing the rest of the area that includes the second recessed area. Employing the photoresist 87 as an etch mask, the exposed portions of the dielectric metal oxide layer 46L' and the second dielectric layer 75 are removed selective to the first conducive material layer 44L. The remaining portion of the dielectric metal oxide layer 46L' is herein referred to as a patterned dielectric metal oxide layer 46. The photoresist 87 is subsequently removed.

Figure 17:
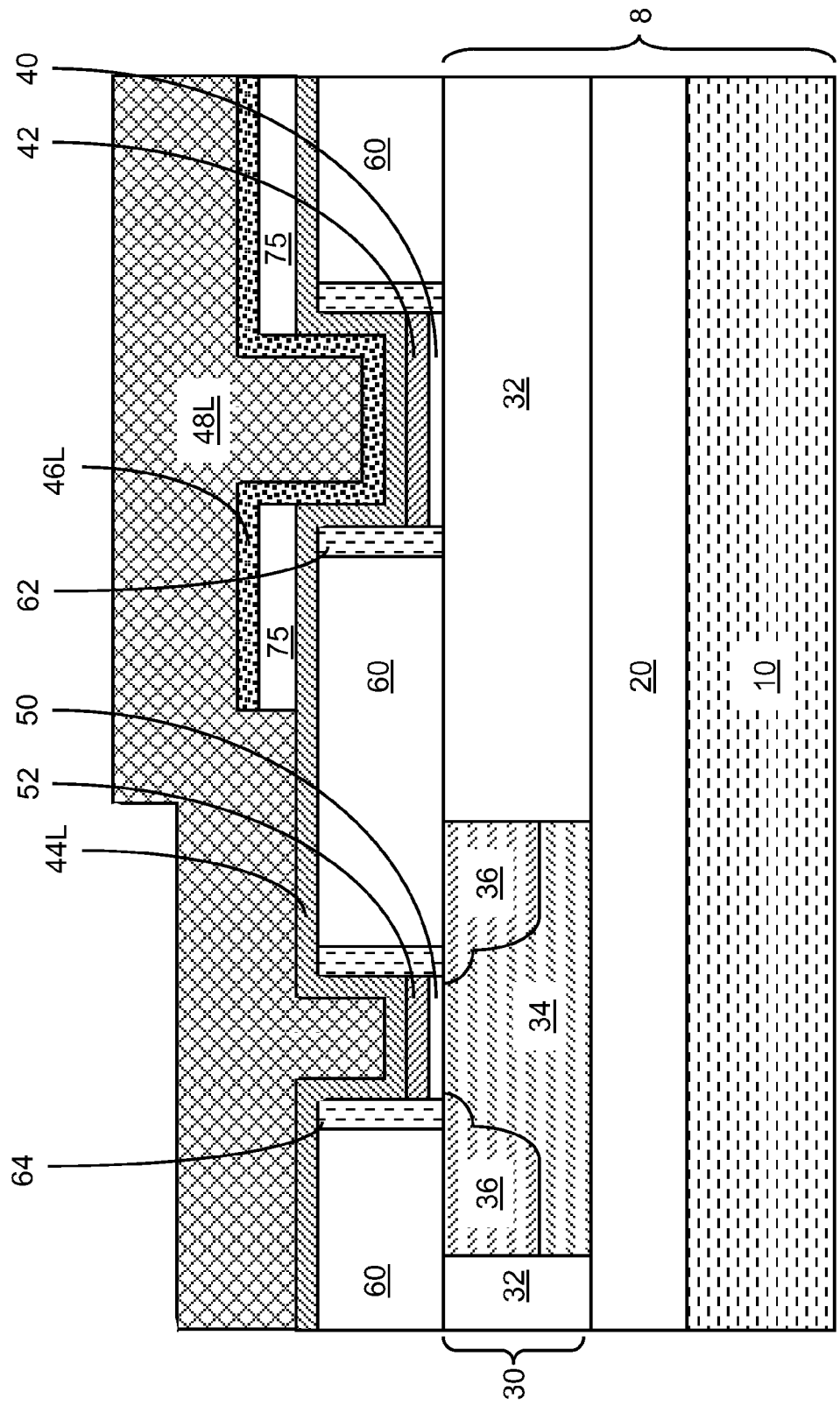
FIG. 17 is a vertical cross-sectional view of the second exemplary semiconductor structure after formation of a second conductive material layer according to the second embodiment of the present invention.

Referring to FIG. 17, a second conductive material layer 48L is formed within the first and second recessed areas and on the exposed surfaces of the patterned dielectric metal oxide layer 46L, the first conductive material layer 44L, and the second dielectric layer 75. The second conductive material layer 48L may have the same composition and thickness, and may be formed by the same methods, as in the first embodiment.

Figure 18:
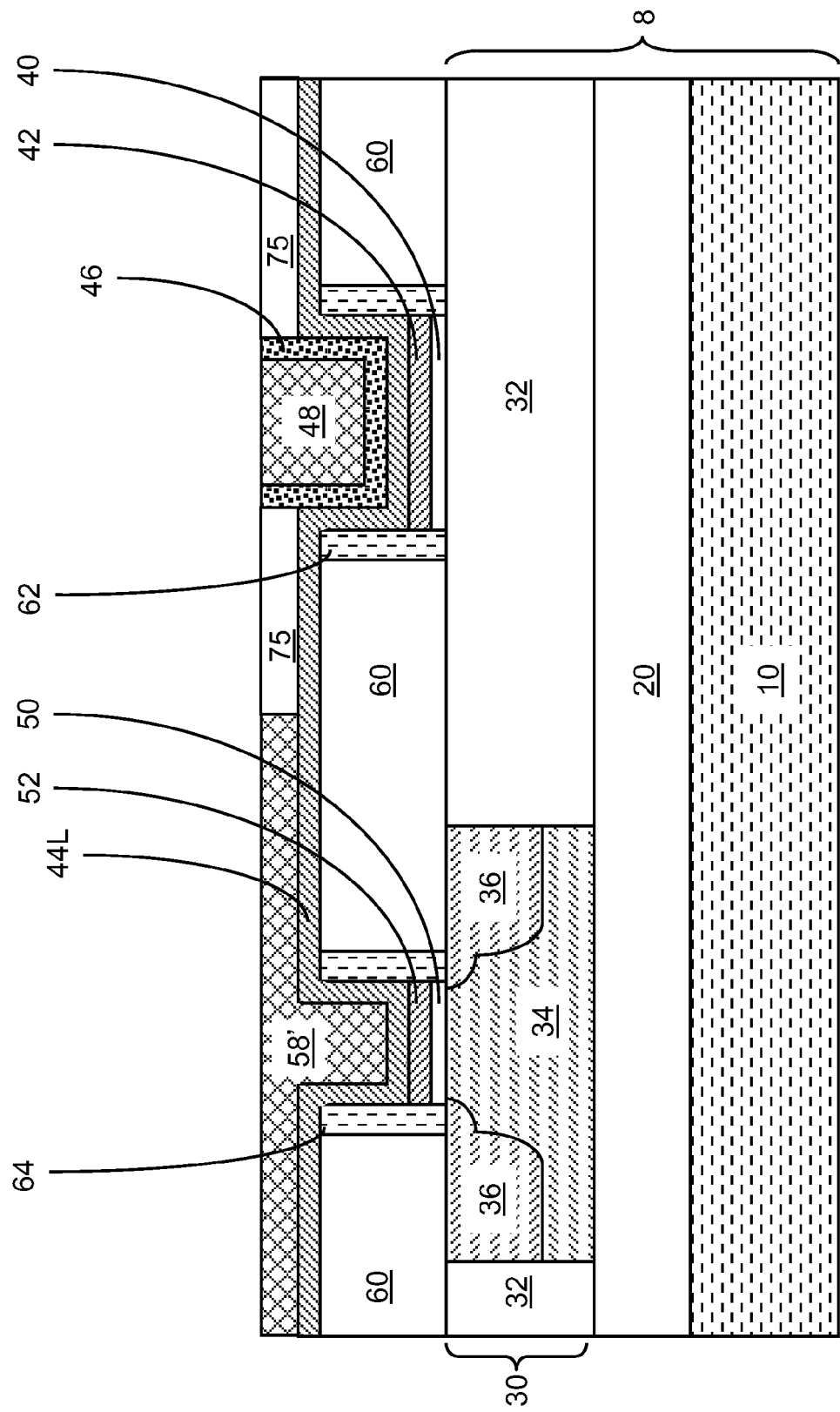
FIG. 18 is a vertical cross-sectional view of the second exemplary semiconductor structure after planarization of the second conductive material layer according to the second embodiment of the present invention.

Referring to FIG. 18, the top surface of the second exemplary semiconductor is planarized to remove the material above the top surface of the second dielectric layer 75. The portion of the second conductive material layer 48L above the top surface of the second dielectric layer 75 and the portion of the patterned dielectric metal oxide layer 46L above the top surface of the second dielectric layer 75 are removed by planarization.

After planarization, the remaining portion of the second conductive material layer 48L located above the first dielectric material portion 40 and within the first recessed area constitutes an inner conductive material portion 48. The remaining portion of the patterned dielectric metal oxide layer 46L within the first recessed area constitutes a dielectric metal oxide portion 46. The remaining portion of the second conductive material layer 48L located above the second dielectric material portion 50 and within the second recessed area constitutes a prototype inner gate conductor portion 58', which extends outside the area of the second recessed area and covers all areas outside of the inner conductive material portion 48, the dielectric metal oxide portion 46, and the second dielectric layer 75.

Figure 19:
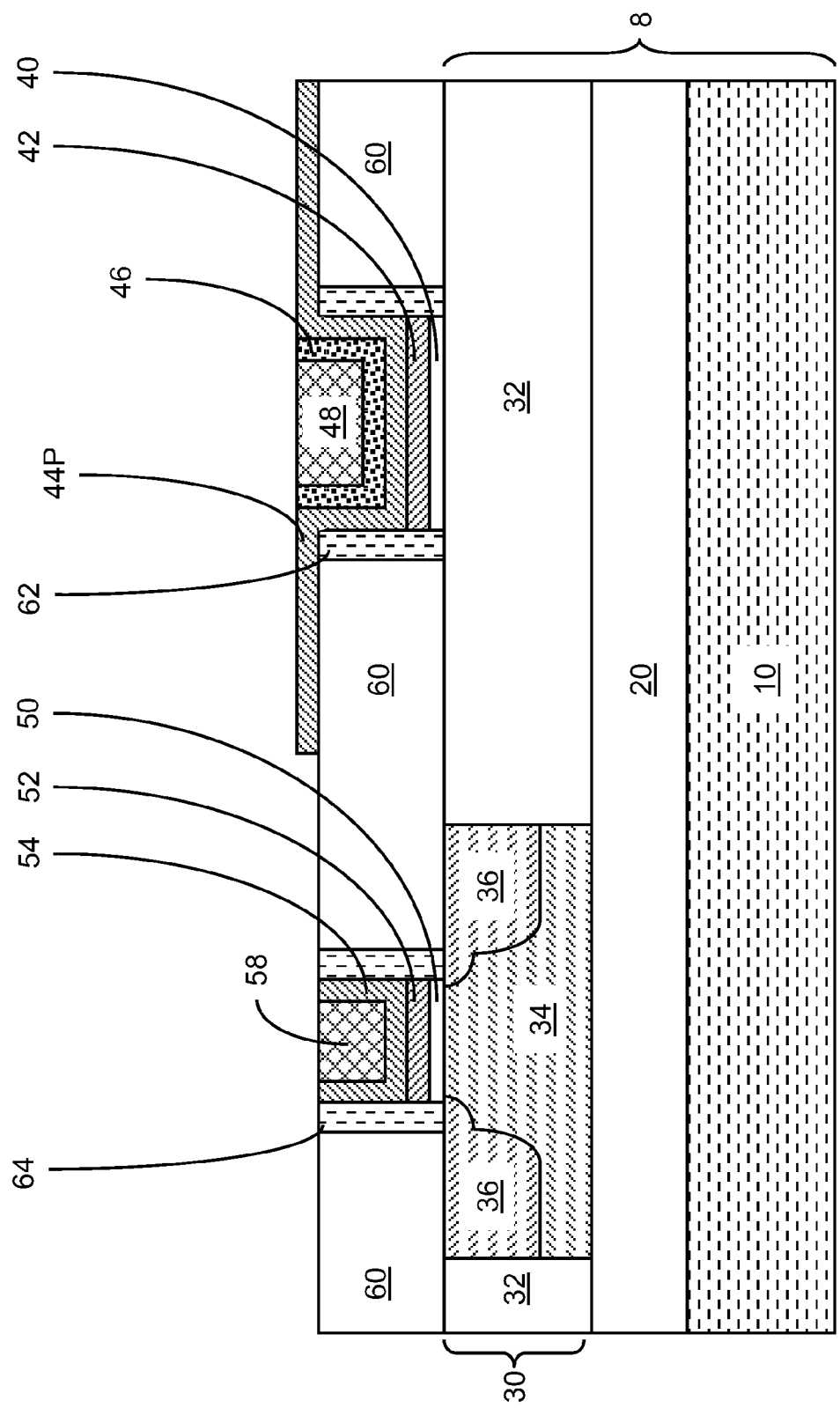
FIG. 19 is a vertical cross-sectional view of the second exemplary semiconductor structure after partial removal of the second conductive material layer according to the second embodiment of the present invention.

Referring to FIG. 19, the second dielectric layer 75 and an upper portion of the prototype inner gate conductor portion 58' are removed, for example, by a recess etch or a second planarization process. Further, the first conductive material layer 44L is patterned, for example, by employing a patterned photoresist (not shown) and an etch that employs the photoresist as an etch mask. The prototype inner gate conductor portion 58' is removed from outside the second recessed area above the second dielectric material portion 50. The remaining portion of the prototype inner gate conductor portion 58' constitutes an inner gate conductor portion 58. The remaining portion of the first conductive material layer 44L within the second recessed area constitutes an outer gate conductor portion 54.

The inner conductive material portion 48 and the dielectric metal oxide portion 46 may, or may not, be recessed during the etch or the planarization process depending on the nature of the process employed to form the inner gate conductor portion 58 and the outer gate conductor portion 54. A remaining portion of the first conductive material layer 44L constitutes an outer conductive material portion 44P. The outer conductive material portion 44P includes a planar bottom portion located beneath the dielectric metal oxide portion 46, a sidewall portion laterally abutting the dielectric metal oxide portion 46, and a planar top portion located above the top surface of the gate level dielectric layer 60.

In some cases, the topmost surface of the outer conductive material portion 44P may be substantially coplanar with the top surface of the dielectric metal oxide portion 46 and the top surface of the inner conductive material portion 48. The topmost surface of the outer conductive material portion 44P may be located above the top surface of the gate level dielectric layer 60 and above the top surface of the first dielectric spacer 62 by a distance that is equal to the thickness of the planar top portion of the outer conductive material portion 44P.

An electrical antifuse includes the inner conductive material portion 48, the dielectric metal oxide portion 46, and the outer conductive material portion 44P. The dielectric metal oxide portion 46 laterally abuts and encloses the inner conductive material portion 48. The outer conductive material portion 44P laterally abuts and encloses the dielectric metal oxide portion 46. The outer conductive material portion 44P is separated from the inner conductive material portion 48 by the dielectric metal oxide portion 46. The first metal portion 42 may be present directly beneath the bottom surface of the outer conductive material portion 44P. The first dielectric material portion 40 is located beneath the outer conductive material portion 44P.

A field effect transistor includes the source and drain regions 36, the body region 35, and the second dielectric material portion 50, which functions as a gate dielectric, and a gate conductor that includes the inner gate conductor portion 58 and the outer gate conductor portion 54. If gate conductor also includes the second metal portion 52, if present.

The inner gate conductor portion 58 and the inner conductive material portion 48 have the same material, and the outer gate conductor portion 54 and the outer conductive material portion 44P have the same composition. The second dielectric material portion 50 and the first dielectric material portion 40 have the same composition.

Figure 20:
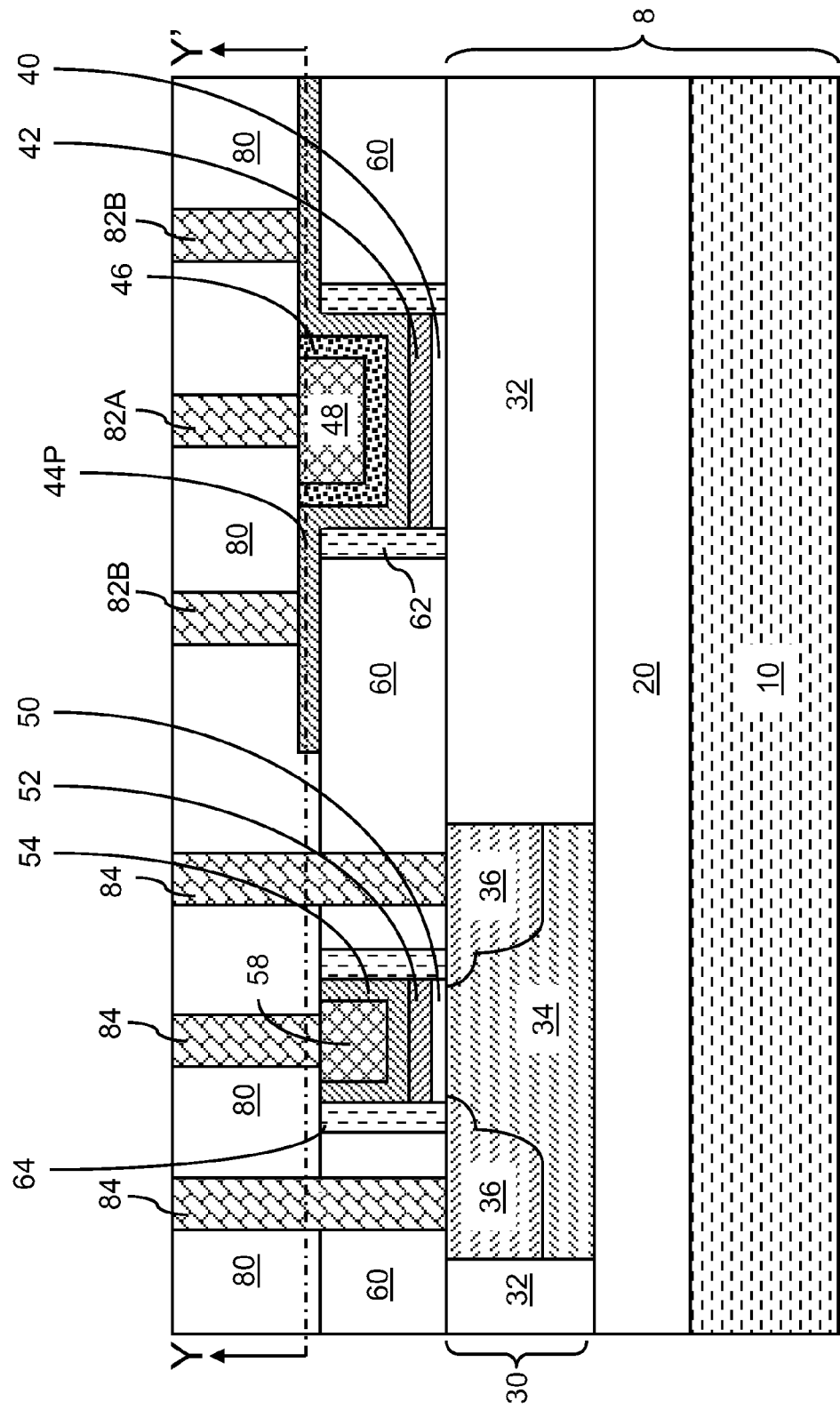
FIG. 20 is a vertical cross-sectional view of the second exemplary semiconductor structure after formation of a contact level dielectric layer and conductive contacts according to the second embodiment of the present invention.
Figure 21:
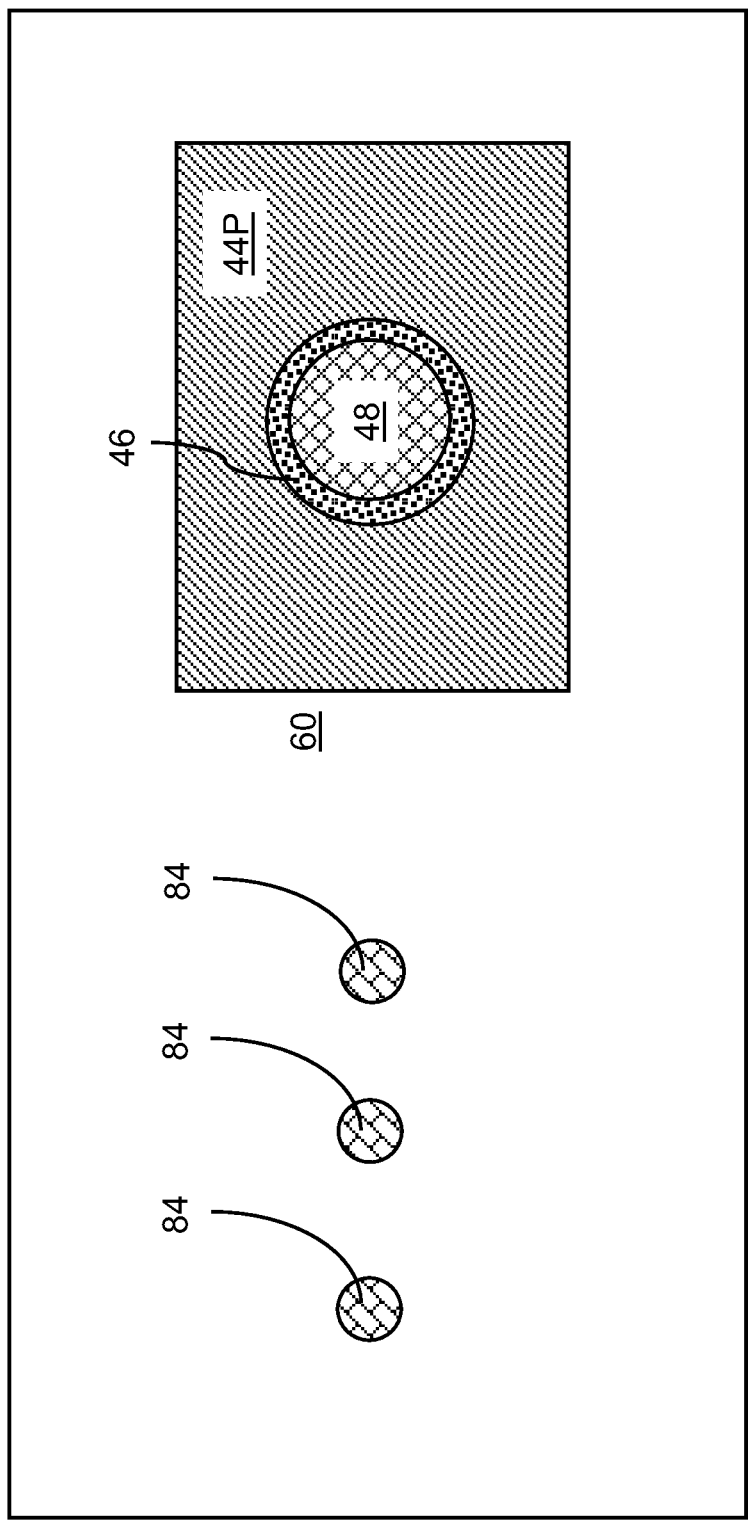
FIG. 21 is a horizontal cross-sectional view of the second exemplary semiconductor structure of FIG. 20 along the plane Y-Y' according to the second embodiment of the present invention.

Referring to FIGS. 20 and 21, a contact level dielectric layer 80 is deposited over the top surfaces of the gate conductor (52, 54, 58), the electrical antifuse (44P, 46, 48), and the gate level dielectric layer 60. The contact level dielectric layer 80 may comprise the same material, and may be formed by the same method, as in the first embodiment.

Various contact via holes are formed in the contact level dielectric layer 80 and filled with metal to from various contact vias. Specifically, a pair of conductive contacts 82B is formed directly on the outer conductive material portion 44P. Further, another conductive contact 82A is formed directly on the inner conductive material portion 48. Additional contact vias 84 may be formed to provide electrical contact to other device components such as the gate conductor (52, 54, 58) and the source and drain regions 36 of the field effect transistor.

Preferably, the first exemplary semiconductor structure includes a semiconductor device (not shown) configured to provide electrical current through the outer conductive material portion 44P of the electrical antifuse (44P, 46, 48). The electrical antifuse (44P, 46, 48) of the second embodiment may be programmed and sensed in the same manner as electrical antifuse of the first embodiment. The planar top portion of the outer conductive material portion 44P facilitates formation of the pair of conductive contacts 82B by providing a larger area for contact.

Figure 22:
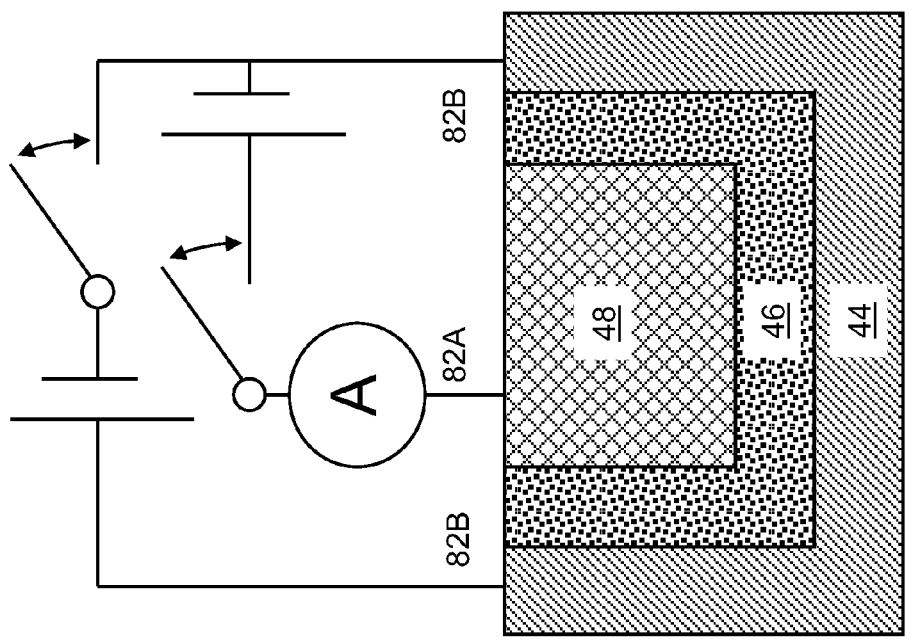
FIG. 22 is a schematic wiring diagram for a programmable electrical antifuse circuit that includes an electrical antifuse of the present invention, a device for supplying a programming current, and a sensing circuit.

Referring to FIG. 22, a schematic wiring diagram for a programmable electrical antifuse circuit is shown. The schematic wiring diagram includes an electrical antifuse (44, 46, 48) of the first or second embodiment of the present invention, a device for supplying a programming current, and a sensing circuit. For example, the device for supplying a programming current may include a power supply circuit and an electrical switch to control the flow of current through the outer conductive material portion 44 (or 44P in the second exemplary semiconductor structure).

As discussed above, programming of the electrical antifuse (44, 46, 48) is effected by passing electrical current through the outer conductive material portion. Sensing of the electrical antifuse (44, 46, 48) is effected by employing a sensing circuit. The sensing circuit includes a device that is configured to measure electrical current through the other conductive contact 82A, the dielectric metal oxide portion 46, and one of the pair of conductive contacts 82B. Specifically, the electrical current or voltage differential across the dielectric metal oxide portion 46 is measured between the inner conductive material portion 48 and the outer conductive material portion 44. Thus, the resistance of the dielectric metal oxide portion 46 is measured during sensing. The state of the electrical antifuse (44, 46, 48) is determined based on the measured value of the electrical current or the voltage differential across the dielectric metal oxide 46 by comparing the measured value with a value generated by a reference device.

While the invention has been described in terms of specific embodiments, it is evident in view of the foregoing description that numerous alternatives, modifications and variations will be apparent to those skilled in the art. For example, though the present invention is described with exemplary structures including a field effect transistor and an antifuse structure, the present invention may be practiced without any field effect transistor. Accordingly, the invention is intended to encompass all such alternatives, modifications and variations which fall within the scope and spirit of the invention and the following claims.

What is claimed is:

1. A semiconductor structure comprising:
   a dielectric layer located on a top surface of a semiconductor substrate; and
   an electrical antifuse located within a recessed area in said dielectric layer, wherein said electrical antifuse includes:
   an inner conductive material portion;
   a dielectric metal oxide portion contacting a bottom surface and a sidewall surface of said inner conductive material portion and laterally enclosing said inner conductive material portion; and
   an outer conductive material portion contacting a bottom surface and a sidewall surface of said inner conductive material portion and laterally enclosing said dielectric metal oxide portion, wherein said outer conductive material portion is spaced from said inner conductive material portion by said dielectric metal oxide portion.

2. The semiconductor structure of claim 1, further comprising:
   a pair of conductive contacts located directly on said outer conductive material portion; and
   a semiconductor device configured to provide electrical current through one of said pair of conductive contacts, said outer conductive material portion, and the other of said pair of conductive contacts.

3. The semiconductor structure of claim 2, further comprising another conductive contact located directly on said inner conductive material portion.

4. The semiconductor structure of claim 3, further comprising a sensing device that is configured to measure electrical current through said another conductive contact, said dielectric metal oxide portion, and one of said pair of conductive contacts.

5. The semiconductor structure of claim 1, wherein said dielectric metal oxide portion comprises a material having different resistivity between an amorphous state and a crystallized state.

6. The semiconductor structure of claim 5, wherein said dielectric metal oxide portion comprises a material selected from titanium oxide, zirconium oxide, tantalum oxide, and niobium oxide.

7. The semiconductor structure of claim 1, wherein said outer conductive material portion comprises a conductive metallic nitride, and wherein said inner conductive material portion comprises an elemental metal.

8. The semiconductor structure of claim 1, further comprising a dielectric spacer embedded in said dielectric layer and laterally abutting outer sidewalls of said outer conductive material portion.

9. The semiconductor structure of claim 1, further comprising a field effect transistor located on said semiconductor substrate, wherein said field effect transistor includes a gate conductor includes an inner gate conductor portion comprising a same material as said inner conductive material portion and an outer gate conductor portion comprising a same material as said outer conductive material portion.

10. The semiconductor structure of claim 9, wherein said field effect transistor further comprises a gate dielectric, wherein said electrical antifuse is located above a dielectric material portion, wherein said dielectric material portion has a same composition as said gate dielectric.

11. The semiconductor structure of claim 1, wherein a topmost surface of said outer conductive material portion is substantially coplanar with a top surface of said dielectric layer, a top surface of said dielectric metal oxide portion, and a top surface of said inner conductive material portion.

12. The semiconductor structure of claim 1, wherein said outer conductive material portion includes a planar bottom portion located beneath said dielectric metal oxide portion, a sidewall portion laterally abutting said dielectric metal oxide portion, and a planar top portion located above a top surface of said dielectric layer.

13. A method of forming a semiconductor structure comprising:
   forming a dummy structure on a semiconductor substrate;
   forming a dielectric layer over said dummy structure and planarizing said dielectric layer;
   removing a portion of said dummy structure and forming a recessed area within said dielectric layer; and
   forming an electrical antifuse within said recessed area, wherein said electrical antifuse comprises:
      an inner conductive material portion;
      a dielectric metal oxide portion contacting a bottom surface and a sidewall surface of said inner conductive material portion and laterally enclosing said inner conductive material portion; and
      an outer conductive material portion contacting a bottom surface and a sidewall surface of said inner conductive material portion and laterally enclosing said dielectric metal oxide portion, wherein said outer conductive material portion is spaced from said inner conductive material portion by said dielectric metal oxide portion.

14. The method of claim 13, further comprising forming a field effect transistor having a gate conductor, wherein said gate conductor includes an inner gate conductor portion comprising a same material as said inner conductive material portion and an outer gate conductor portion comprising a same material as said outer conductive material portion.

15. The method of claim 13, further comprising:
   forming a first conductive material layer within said recesses area;
   forming a dielectric metal oxide layer directly on said first conductive material layer;
   patterning said dielectric metal oxide layer; and
   forming a second dielectric layer directly on said first conductive material layer and a remaining portion of said dielectric metal oxide layer.

16. The method of claim 15, further comprising:
   patterning said second dielectric layer to expose at least a portion of said remaining portion of said dielectric metal oxide layer;
   forming a second conductive material layer directly on said second dielectric layer and said remaining portion of said dielectric metal oxide layer; and
   planarizing said second conductive material layer and said second dielectric layer, wherein a remaining portion of said second conductive material layer constitutes said inner conductive material portion and a portion of said dielectric metal oxide layer constitutes said dielectric metal oxide portion.

17. The method of claim 13, further comprising:
   forming a first conductive material layer within said recesses area;
   forming a second dielectric layer directly on said first conductive material layer;
   patterning said second dielectric layer to exposed at least a portion of said first conductive material layer within said recessed area;
   forming a dielectric metal oxide layer directly on a portion of said first conductive material layer and said second dielectric layer;
   forming a second conductive material layer directly on said dielectric metal oxide layer and a portion of said first conductive material layer; and
   planarizing said second conductive material layer and a portion of said dielectric metal oxide layer.

18. A method of operating an electrical antifuse comprising:
   providing an electrical antifuse including:
      an inner conductive material portion;
      a dielectric metal oxide portion contacting a bottom surface and a sidewall surface of said inner conductive material portion and laterally enclosing said inner conductive material portion and comprising an amorphous dielectric metal oxide material; and
      an outer conductive material portion contacting a bottom surface and a sidewall surface of said inner conductive material portion and laterally enclosing said dielectric metal oxide portion, wherein said outer conductive material portion is spaced from said inner conductive material portion by said dielectric metal oxide portion; and
   passing electrical current through said outer conductive material portion, whereby heat from said outer conductive material portion transforms an amorphous state of said dielectric metal oxide portion into a crystalline state.

19. The method of claim 18, further comprising measuring electrical current or voltage differential across said dielectric metal oxide portion between said inner conductive material portion and said outer conductive material portion, whereby resistance of said dielectric metal oxide portion is measured.

20. The method of claim 19, further comprising determining a state of said electrical antifuse based on a measured value of said electrical current or said voltage differential across said dielectric metal oxide by comparing said measured value with a value generated by a reference device.

* * * * *